United States Patent
Morozov et al.

(10) Patent No.: US 7,368,288 B2
(45) Date of Patent: May 6, 2008

(54) DETECTION AND RECOGNITION OF ANALYTES BASED ON THEIR CRYSTALLIZATION PATTERNS

(75) Inventors: Victor Morozov, Manassas, VA (US); Charles L. Bailey, Cross Junction, VA (US); Nikolai N. Vsevolodov, Kensington, MD (US); Adam Elliott, Manassas, VA (US)

(73) Assignee: George Mason Intellectual Properties, Inc., Fairfax, VA (US)

( * ) Notice: Subject to any disclaimer, the term of this patent is extended or adjusted under 35 U.S.C. 154(b) by 0 days.

(21) Appl. No.: 11/397,908

(22) Filed: Apr. 5, 2006

(65) Prior Publication Data

US 2006/0275824 A1    Dec. 7, 2006

Related U.S. Application Data

(60) Provisional application No. 60/668,079, filed on Apr. 5, 2005.

(51) Int. Cl.
*G01N 21/00*    (2006.01)
(52) U.S. Cl. .............. 436/4; 436/15; 436/55; 436/86; 436/174; 436/180
(58) Field of Classification Search ............ None
See application file for complete search history.

(56) References Cited

U.S. PATENT DOCUMENTS 6,350,609 B1    2/2002    Morozov 6,808,934 B2 *  10/2004   Mutz et al. ............... 436/180

OTHER PUBLICATIONS

Koide et al. "Urinary crystal surface binding substances on calcium oxalate crystals", Urol. Res., 1990, v. 18, pp. 387-392.*
Gosalia, D.N. et al., "Printing Chemical Libraries on Microarrays for Fluid Phase Nanoliter Reactions," Proceedings of the National Academy of Sciences of the United States of America, Jul. 8, 2003, pp. 8721-8726, vol. 100, No. 15, The Scripps Research Institute, La Jolla, CA.
Horoiuchi, K.Y. et al., "Microarrays for the Functional Analysis of the Chemical-Kinase Interactome," Journal of Biomolecular Screening. Nov. 28, 2005, pp. 1-9, OnlineFirst: 0: 1087057105282097v1, Society for Biomolecular Sciences, Danbury, CT.
Salata, O.V. et al., "Tools of Nanotechnology: Electrospray," Current Nanoscience, 2005, pp. 25-33, vol. 1, Bentham Science Publishers, Ltd., Oak Park, IL.

* cited by examiner

*Primary Examiner*—Yelena G. Gakh
(74) *Attorney, Agent, or Firm*—David Yee; David Grossman

(57) ABSTRACT

The invention contemplates a method for recognition of proteins and other biological molecules by imaging morphology, size and distribution of crystalline and amorphous dry residues in droplets (further referred to as "crystallization pattern") containing predetermined amount of certain crystal-forming organic compounds (reporters) to which protein to be analyzed is added. It has been shown that changes in the crystallization patterns of a number of amino-acids can be used as a "signature" of a protein added. It was also found that both the character of changer in the crystallization patter and the fact of such changes can be used as recognition elements in analysis of protein molecules.

19 Claims, 15 Drawing Sheets

Cleaning in Plasma Discharge

Burning off hydrophobic layer through a mask

Hydrophobization in DDS vapor

Patterned substrate

Create a first sample by combining an analyte in a reporter solution

Crystallizing the first sample

Compare the crystals with a crystallized pattern of a second sample that includes the reporter without the analyte

DETECTION AND RECOGNITION OF ANALYTES BASED ON THEIR CRYSTALLIZATION PATTERNS

CROSS REFERENCE TO RELATED APPLICATIONS

The present application claims the benefit of provisional patent application Ser. No. 60/668,079 to Morozov et al., filed on Apr. 5, 2005, entitled "Detection and Recognition of Analytes," which is hereby incorporated by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of DOE Grant No. DE-F C52-04NA25455 awarded by the U.S. Department of Energy.

DETAILED DESCRIPTION

The disclosure embodies a method and system for recognizing analytes. Recognition may incorporate binary codes for difference concentrations of analytes and unknown substances.

Figure 1:
FIG. 1 shows an example of a flow diagram for recognizing an analyte.
Figure 1:
Figure 2:
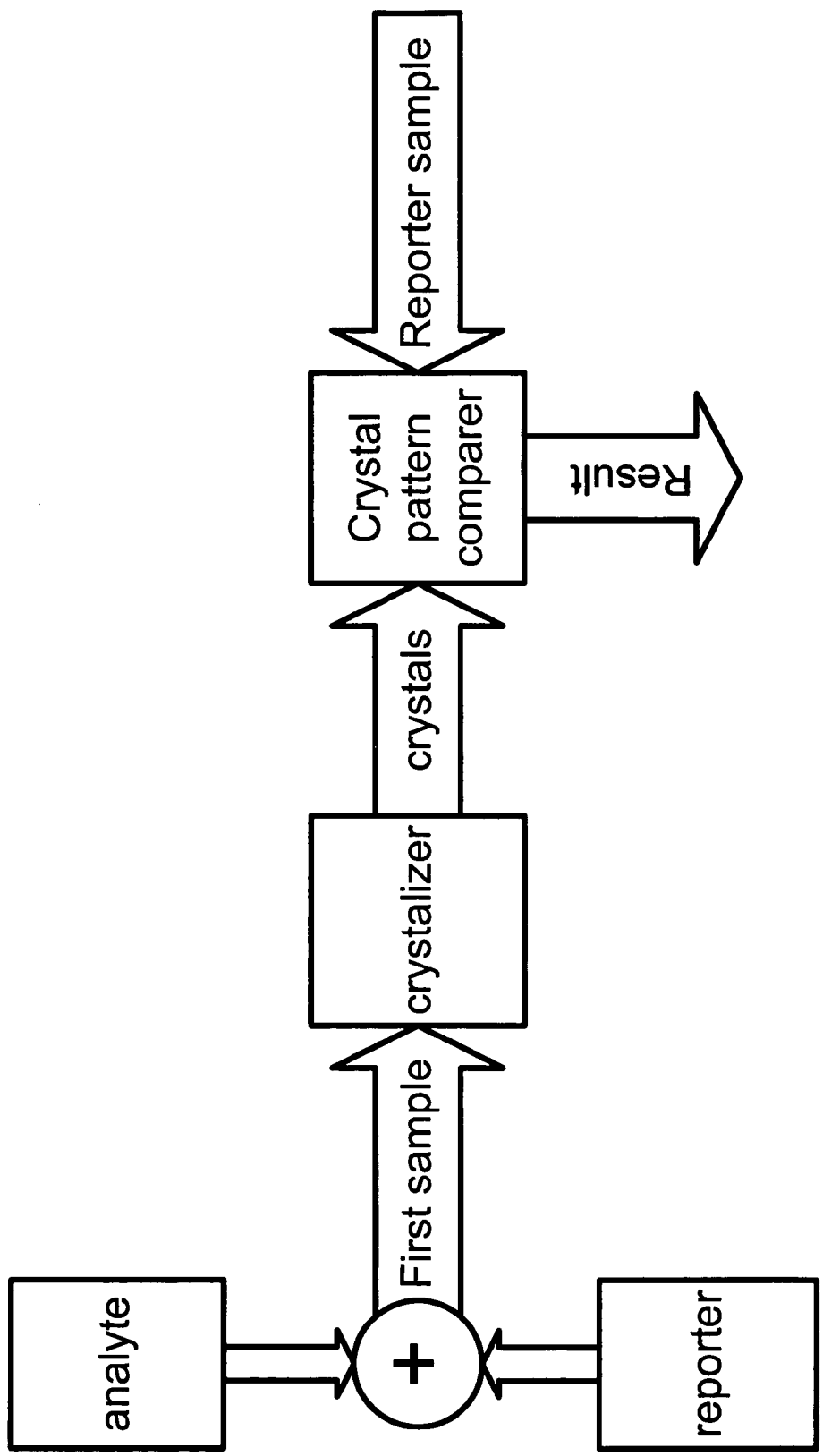
FIG. 2 shows a block diagram of a system for recognizing an analyte.

Referring to FIG. 1, a method for recognizing an analyte may include creating a first sample, crystallizing the first sample and comparing the crystals with a crystallized pattern of a second sample.

The first sample may be created by combining an analyte in a reporter solution having a reporter. Crystallization may be achieved used various methods, including but not limited to, drying, endothermic reaction, exothermic reaction, adding an additional solvent (e.g., water, methanol, ethanol, etc.), pressure, etc. The second sample, also referred to as control, may be a reporter solution having only a reporter. The control should not have any analyte.

The reporter may be a molecule selected from a multitude of criteria. Examples of criteria include, but are not limited to, the reporter's water solubility; toxicity; chemical inertness; ability to keep the tertiary structure of said analyte the same; ability to denature; speed of crystallization; quantity of functional chemical groups; bond strength; optical activity; and cost.

As an embodiment, the reporter may be selected from among a multitude of molecules, compounds or biological macromolecules. Examples include, but are not limited to, amino acids, salts of organic acids, metabolites, phosphorylated compounds, vitamins, biochemical metabolites capable of being be used as crystal-forming substances, and inert chemical compounds.

The method may further include creating a plurality of droplets on a substrate, said droplets comprising at least one reporter. An analyte solution containing at least one analyte may be added to these droplets. These droplets may then be dried, and thus form a dried residue. This dried residue may be compared to the control.

The method may also further include combining the droplets having said reporter with droplets having at least analyte. This combination may create a plurality of combined droplets. To this combination, analyte solution may be added by spraying said analyte solution. Those that are sprayed may be charged and directed to deposit on the plurality of droplets having a reporter. A plurality of combined droplets may be formed on a patterned substrate providing array of hydrophilic areas of predetermined size and shape on a hydrophobic background.

The analyte solution may be moved over the surface of said substrate said moving forming a plurality of droplets on a pretreated substrate.

Pretreatment may include smoothing the the surface roughness without affecting the dialysis membrane's ultrafiltration properties, a couple of techniques may be used. Generally, the techniques involve applying polymers (e.g., cross-linked polymers, natural polymers (with or without synthetic properties), synthetic polymers, etc.) to the surface of the dialysis membrane. However, because layers of polymers tend to peel off the surface when directly applied, surface adhesion should be enhanced. As one embodiment, the dialysis membrane may be treated with plasma discharge to enhance adhesion of glues and/or coating by introducing a variety of functional groups.

Prior to plasma treatment, plasma effects on the surface roughness may be tested. One way of testing this effectiveness is using the following exemplified procedure.

To enable simultaneous measurements of etching depth and changes in the surface roughness, part of the surface may be protected with dry sucrose prior to plasma treatment. Sucrose may be electrospray deposited from a 2% water solution through a polystyrene or nylon mesh mask on a dialysis membrane surface as an array of dry spots, where each spot may be approximately 10 μm in diameter and spaced apart by 50 μm. After deposition, the membrane may be briefly exposed to damp air to produce microdroplets of sucrose solution, which may then be dried in a stream of warm air forming dry sucrose caps of about 1.5-2 μm thick. After exposure to plasma discharge, the membrane may be placed in water for 3-5 min to dissolve the residual sucrose layer and expose protected spots. Small disks (approximately 5-7 mm in diameter) may be punched from the membrane and glued to a microscope slide using 5% poly (vinylpyrrolidone) (PVP). The surface of protected spots may be used as a reference in measurements of ablation depth under AFM.

Ablation depth may be used as a measure of plasma treatment in evaluating the effect in terms independent of the specific geometry of the plasma reactor, power distribution inside the reactor and other details. To measure the ablation depth, an array of protective dry sucrose spots may be fabricated on the membrane surface as described above. After treatment in plasma and washing sucrose away, two independent parameters may be determined in different places on the membrane: depth of ablation in plasma (measured as a height of a step at the boundary between protected and unprotected areas) and the average roughness of the plasma-treated surface. Generally, the level of roughness increased as the area measured was increased. Thus, roughness of the dialysis membrane treated for 20 sec in plasma slowly increased from 3 to 8 nm at $S=0.5$ $\mu m^2$ to 15-20 nm at $S=250$ $\mu m^2$. Surface roughness be characterized by measuring the rms roughness within a 0.7 μm square, which may be close to the size of analytes (e.g., fd bacteriophages).

No notable changes in the surface roughness are observable after a short-term (e.g., 10-15 sec) exposure to plasma, when etching depth does not exceed 200 nm. Deeper ablation may be accompanied by an increase in the surface roughness, which may increase by approximately 30 nm/1 μm of ablation. Hence, a short-term exposure to plasma (e.g., 15-20 sec) may be used to activate surface of the membrane before "lacquering".

Having treated the surface of the dialysis membrane with plasma, the ability of polymers to stay on the surface once introduced increases. In essence, one technique of smoothing the surface. A polymer solution, having polymers such as the cross-linked polymers as embodied above, may be applied to the surface of the dialysis membrane attached to a ring. The solution is facing a Petri dish. Typically, as the polymer solution is slowly dried through the dialysis membrane, a thin and smooth polymer layer is allowed to form at the air/solution interface. This additional layer may have a size of, as non-limiting examples, at least 1 nm, 5 nm, 10 nm, 25 nm, 50 nm, 100 nm, 250 nm, 500 nm or even 1 μm.

Various cross-linked polymers were tested. Examples include, but are not limited to, gelatin A, gelatin B, chitosan, dextrans and globular proteins. Among those tested, coating the substrate with globular protein BSA resulted in the smoothest surface. A BSA molecule has an average diameter of about 5 nm. The root mean square (rms) for roughness was about 0.3-0.4 nm. If smaller rms roughness of the BSA surface exists, it is possible that there may be partial unfolding of BSA globules on the surface. If AFM is performed, then it is possible to have a smaller rms because of a relatively large radius on the AFM curvature tip (i.e., approximately 10 nm), which may overlook small cavities between BSA globules.

By filling in irregularities on the surface of the membrane, the layer of cross-linked polymers may produce a smooth surface. Smoothing the layer may be achieved by having the upper layer of the cross-linked polymers flattened by surface tension.

Having pretreated the surface of the substrate, the plurality of droplets having said analyte may be combined with the dried residue.

A comparison between the crystals with a crystallized pattern of a second sample by using a binary code to each of the analyte. The binary may include a value of 1 for at least one difference and a value of 0 for no change.

A system may be construct to implement these methods. As illustrated in FIG. 2, the system may have a first sample, a crystallizer and a comparer.

Definitions

“Analyte” means any substance which presence in a solution should be recognized and/or which concentration should be estimated.

“Biological Macromolecules” means any molecule of biological origin with a molecular mass exceeding 2 kDa.

“Control” denotes otherwise identical preparation (solution, droplet, etc.) to which a reference solution was added in the amount identical to those used in preparation of the sample when the latter is prepared by adding an aliquot of analyte solution to a solution of a crystal forming substance.

“Crystal Forming Substance” or “Reporter” is any substance which produces optically visible crystals upon drying a droplet of its solution in less than 30 min.

“Crystallization Pattern” means a set of characteristics observed in the dried droplet which can be distinguished by a trained operator or by a special software.

“Recognition” means distinguishing between two or more macromolecules taken in similar molar concentrations.

“Sample” means solution or droplet or dried droplet which contains analyte added as a solid or liquid aliquot.

Introduction

Most bioanalytical procedures are based on the recognition of analytes with natural specific probe molecules, such as enzymes, antibodies, or complementary DNA. Examples of analytes include, but are not limited to, biological macromolecules, proteins, enzymes, lipids, polysaccharides, carbohydrates (simple and complext), DNA/RNA molecules, oligonucleotides, antibodies, lectins, pathogens (e.g., bacteria, viruses, bacteriophages, spores), fungi, etc.

Analyte recognition may be determined by a limited number of interactions (e.g., Van der Waals interactions, hydrogen bonding, ionic bonding, etc.), which may be spatially organized within a binding site on the probe molecule that complement receptive groups and atoms on the analyte molecule. One major practical limitation of all such detection techniques involves the instability of the biological probe molecules. This instability may limit their shelf life. Hence, these biological probe molecules may require special storage conditions.

Another known principle of analyte recognition involves physical methods where spectral characteristics (e.g., Nuclear Magnetic Resonanace Spectroscopy (NMR), Infrared Spectroscopy (IR), Tandem Mass Spectroscopy (MS/MS), etc.) may be used to distinguish molecules among molecules, provided a database of spectra for all possible analytes is available. However, such physical methods tend to be limited by their complexity. This limitation may increase the cost per assay due to the need for expensive equipment and trained personnel.

It may be possible to recognize complex biological substances without using fragile biological probe molecules or complex physical instruments. One such alternative is provided by chromatography, in which tiny differences in affinity of analytes to a specific resin result in their separation. A set of numbers characterizing the mobility of an analyte in a series of columns with different packing material can potentially serve as a “signature” of this analyte. However, it is technically difficult to repeatably determine such parallel chromatographic measurements in the multiple columns necessary for recognition.

Small differences in the binding of analytes to different surfaces can be easily detected in an array of organic and inorganic crystals. Such arrays may provide a rich variety of surfaces for analyte adsorption since each crystal exposes a unique mosaic of chemical groups on its planes, edges, and defects. Moreover, crystals themselves may serve as detectors of analyte binding. It is well known in the art that crystal growth can be highly sensitive to the presence of impurities, which may inhibit their growth by changing the probability of seed formation or may modify crystal morphology. Since the end result of such modifications may be easily detectable via optical imaging, an array of different reporter substances can be tested for sensitivity to a specific analyte. The changes detected, expressed in a certain "code," may be used as the analyte "signature."

A number of proteins have evolved to modify organic and inorganic crystals. Thus, several unrelated proteins have been found in arctic fishes that are capable of binding to certain planes in ice crystals and inhibiting ice formation in biological fluids. Many crystallization inhibitors have also been described in animals and in humans. Examples include, but are not limted to, nephrocalcin in urine, gallstone protein in bile and lithostathine in pancreatic juice. It was shown that lithostathine may inhibit nucleation and may modify morphology of calcite by preferable binding to a certain edge in the calcite crystal. Specialized proteins capable of establishing interactions with certain crystal faces in carbonated apatite and calcite minerals may control formation of shells, sea urchin needles, and dental tissue. Selective adsorption to different surfaces is not necessarily limited to specialized proteins. For example, serum albumin and fibrinogen may display quite different preferences for hydrophilic and hydrophobic surfaces.

Selecting Crystal Forming Substances/Reporters

When choosing a reporter, various criteria may be taken into consideration. Among those include, but are not limited to the following examples.

Reporters should be water soluble. Reporters should be nontoxic so that only minor precautions need to be heeded. Reporters should be chemically inert with respect to analytes on the time scale of the assay (e.g., 3-30 min). For example, where proteins are the analyte of interest, no notable chemical reaction between the substance and the amino-, carboxyl- and any other available functional groups on the protein surface should proceed during time scale of the assay analysis (3-30 min). Moreover, the tertiary structure of the analyte should not change. Referring to proteins as the example, substances like urea and guanidinium hydrochloride, which tend to be known for their ability to denature protein molecules, should be avoided.

Additionally, reporters should be able to rapidly crystallize upon drying (e.g., 3-30 min). Reporters should also be crystallizable in multiple forms (i.e., propensity to polymorphism). Reporters should provide a variety of chemical groups, capable of establishing contacts with known groups on a protein surface, such as $H_2N$—, HOOC—, etc. Reporters that make very strong bonds upon crystallization, like ions in NaCl crystals, should be avoided to prevent possible "displacement" of weakly bound protein molecules from the surface of growing reporter crystal. Reporters should be optically active in order to recognize stereoisomeric analytes such as proteins. Above all, it would be helpful if reporters are inexpensive.

An obvious candidate group as reporters is amino acids because they can satisfy these conditions. Amino acids may include peptides, di-peptides and tri-peptides.

Amino acids may be tested in initial experiments to find an optimal amino acid solution concentration. Drying/Crystallization Patterns (DCPs) acquired from a series of solutions with amino acid concentrations ranging from 0.1 to 20 mg/mL may be evaluated for reproducibility and for the number of distinguishable DCP features. Based on these criteria, a subset of amino acids (Cys, Asp, Glu, Tyr, Arg, His) may be discarded from further testing because they generally fail to produce DCPs. From the remaining amino acid solutions, concentrations less than 1 mg/mL may produce relatively featureless images. An explanation for featureless images is that the solubility limit may be reached later upon drying and less material is available for crystal formation. Solutions with concentrations of 5-10 mg/nL tend to be optimal. On average, 15-18 images may be obtained for each amino acid control and each protein/amino acid mixture to determine typical patterns and their variabilities.

Of these images, 70-80% may display identical DCPs, while 10-20% of the images at the beginning and at the end of each series may display slightly different DCPs, which may be presumably due to variability in the amount of solution deposited onto these spots. This conclusion is supported by an analysis of DCPs obtained from microdroplets deposited by the Hamilton microsyringe technique, where all DCPs were absolutely identical.

Besides amino acids, other candidate reporters may satisfy the above conditions. For example, salts of organic acids (e.g., carbonates, phosphates, etc.), metabolites (e.g., glucose), phosphorylated compounds (e.g., AMP, ADP, glucose-6-phosphate, etc.), vitamins and other known biochemical metabolites can also be used as crystal-forming substances. Finally, a large number of inert chemical compounds, like organic buffers, (e.g., MES, TES, PIPES, HEPES, TRIS, etc.) may be added to the list of possible reporter molecules.

In addition to satisfying conditions, candidate reporters for crystalline structures may be selected by analyzing substances with known X-ray structures. Standard software could be used to analyze possible modes of interaction between planes, edges and other elements of the crystals with protein molecules. Protein structure should also be known with atomic resolution from X-ray analysis. Such "theoretical screening" preceding a physical screening may save a lot of effort and time in choosing rational set of crystal-forming substances with a required "specificity" within a certain class of substances, e.g., toxins.

However, another condition should also be considered. The crystal lattice of the potential reporter should not be excessively strong (e.g., as in the case of ionic crystals) so that the reporter molecules may not be able to displace the analyte from the growing crystal. Yet, reporter crystals with low lattice energy (e.g., protein crystals, etc.) should also be avoided since their crystallization tends to proceed slowly. In principle, reporter molecules may be rationally selected for a certain set of analytes by a theoretical modeling of interactions of these analytes with the surface elements of the reporter crystals.

Screening Crystal Forming Substances/Reporters

Various approaches in evaluating specific interactions between crystals of small organic substances and macromolecular analytes may be used.

Figure 3:
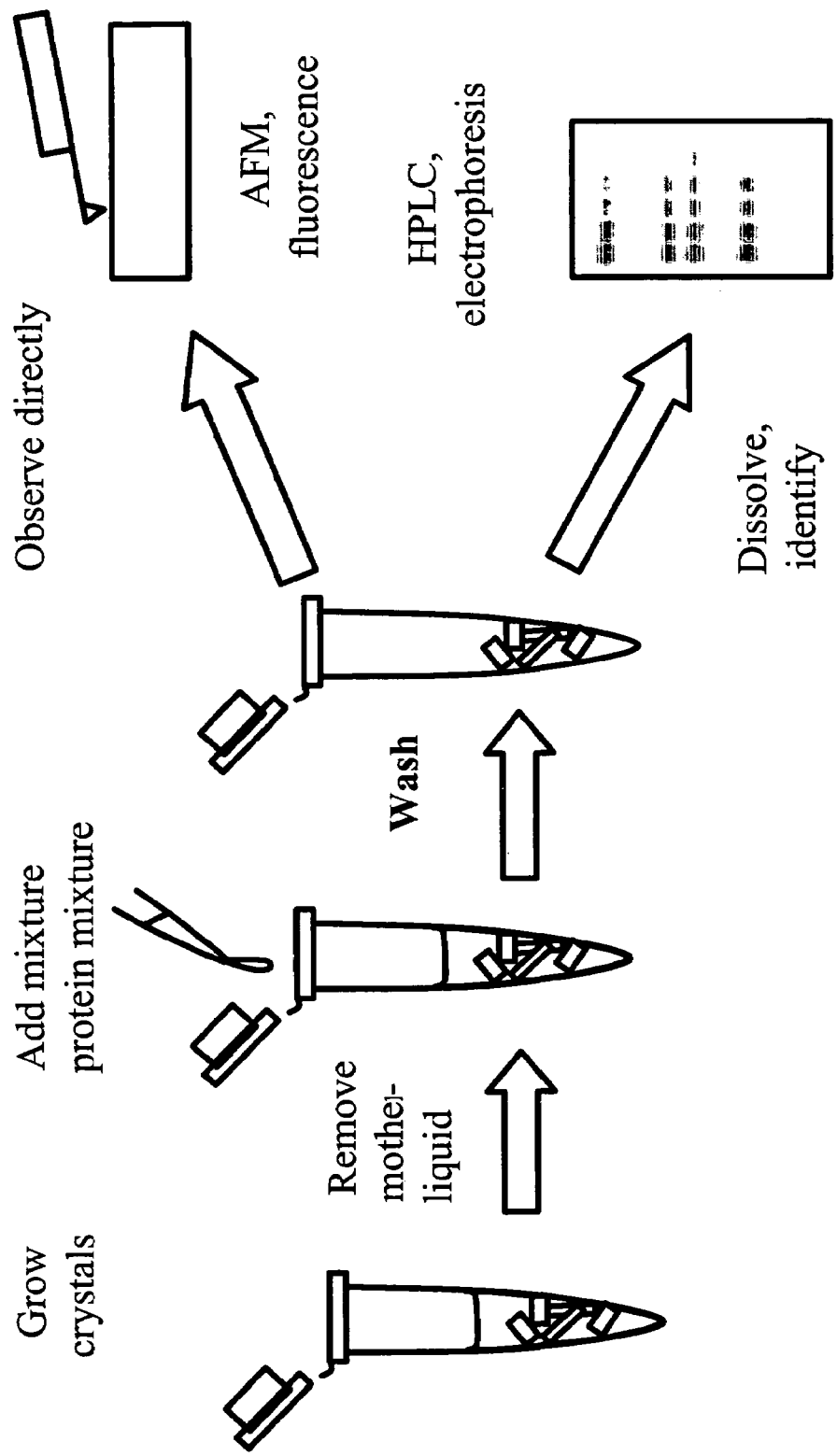
FIG. 3 shows a mixture of proteins added to a solution of a crystal forming substance.

As illustrated in FIG. 3, a mixture of proteins may be added to a solution of a crystal forming substance. The crystal forming substance is allowed to dry and crystallize. Crystals that are formed may be collected and shortly rinsed with a saturated solution of the crystal forming substance. After rinsing, the crystals may be rapidly collected by centrifugation or filtering. The collected crystals may then be dissolved, dialyzed or desalted on a column. The solution may be analyzed for the presence of the proteins by high performance liquid chromatography (HPLC), PAAG electrophoresis or any other available technique. This protocol may allow for a rapid evaluation of an ability of each particular crystal-forming compound to specifically bind certain proteins and reject the others.

Once binding proteins are established, their location on the crystal surface may be further found by labeling the analytes with an isotope or fluorescent label. Alternatively, a fluorescently labeled antibody specific to the protein may be used.

Figure 4:
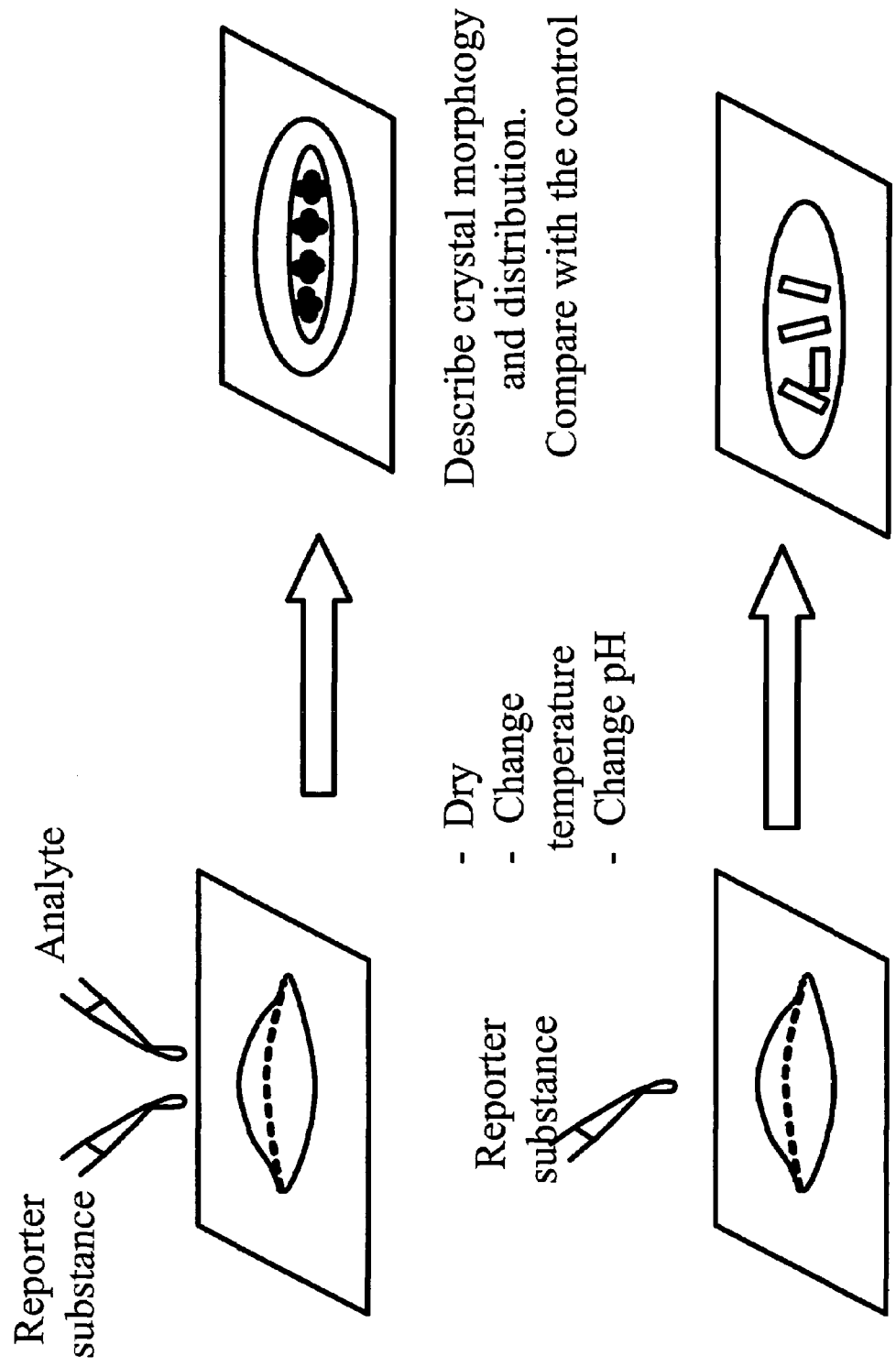
FIG. 4 shows an exemplified screening technique.

The binding of proteins may result in notable changes of the size and morphology of the crystals. However, direct screening of protein effects on the crystalline pattern may be considered the final and decisive part of the screening in selecting a rational set of crystal forming substances/reporters. In the exemplified screening technique as shown in FIG. 4, a given amount of a crystal forming substance is added to a protein solution and the mixture is allowed to dry. The crystal pattern is then compared with that in the control. Except for the absence of protein, the control is practically identical to that of the mixture.

EXAMPLES OF PROCEDURES FOR THE PREPARATION OF MATERIALS

1. Reagents

A set of L-amino acids was obtained from Sigma (kit, LAA-21; minimum 98-99% purity) and used without purification. Chicken egg albumin (Ova), bovine hemoglobin (Hb), hen egg white lysozyme (HEWL), concanavalin A (Con A), bovine serum albumin (BSA), and human apo-transferrin (apo-F) were also obtained from Sigma (St. Louis, MO.).

2. Preparation of Proteins

Proteins were thoroughly dialyzed against ultrapure water until the solution conductivity reached a plateau. The conductivity of the dialyzed protein solutions was measured in a 4-μL cell manufactured in the laboratory. Protein concentration in the dialyzed samples was measured with a precision of 15-20% on a homemade quartz crystal microbalance (QCM). The microbalance was calibrated by drying a sucrose solution on the quartz resonator. Protein concentrations were measured by drying 0.2-0.4 μL of the dialyzed sample on the QCM.

3. Preparation of Substrate Surface

Microdroplets may be directly deposited onto a uniform substrate surface. However this procedure may present a major disadvantage. Depending on the composition of droplets (e.g., presence of surface active substances), drying time and drying conditions, the size of the dry residue will tend to vary. This variation may make any comparison difficult. Hence, the size of dried droplets should be kept constant. The size may be independent of its composition and drying conditions.

One way to keep the size of the drying droplets constant includes modifying the substrate surface. Modification may be accomplished by creating an array of highly hydrophilic spots on a highly hydrophobic background.

Figure 5:
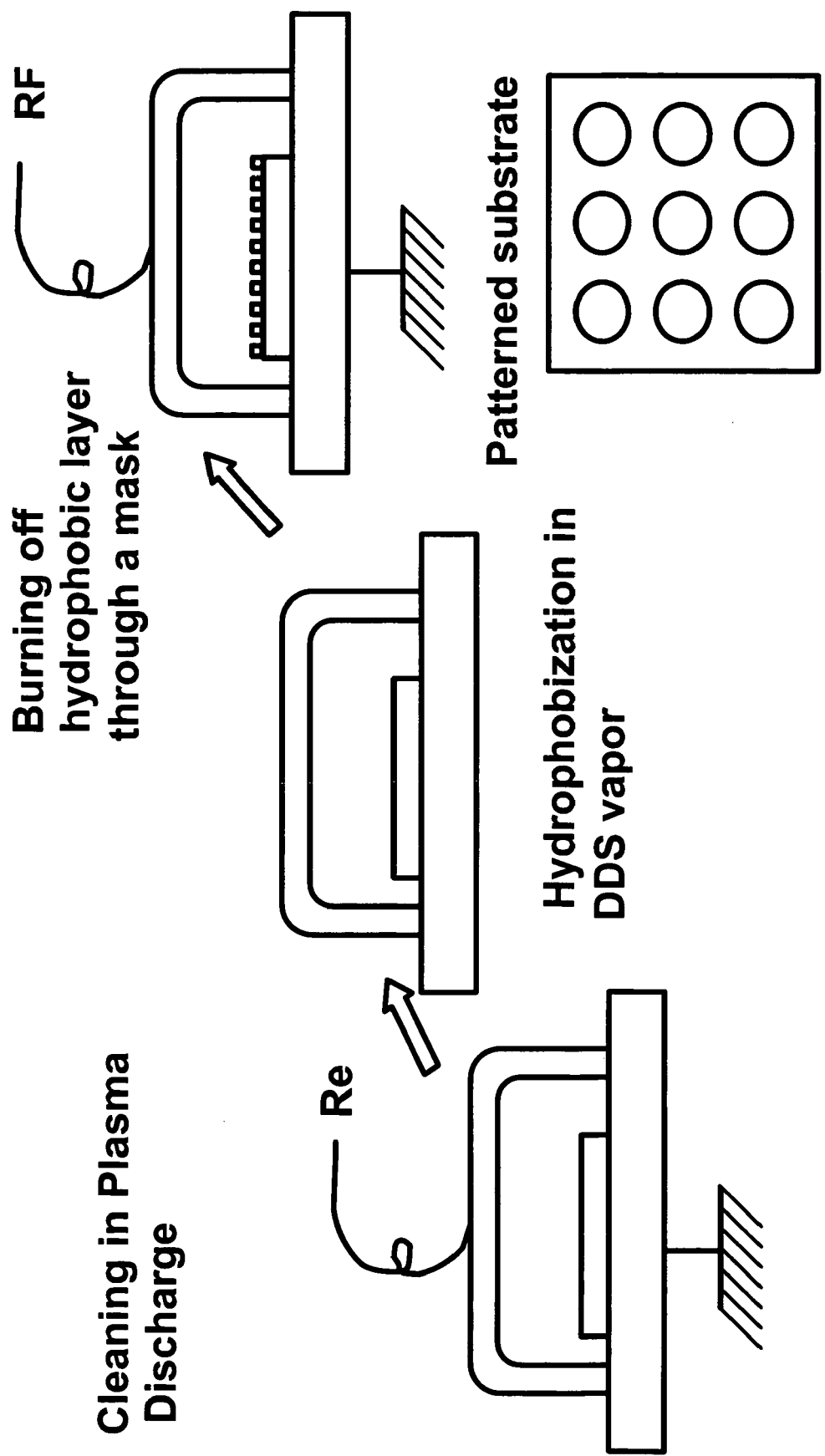
FIG. 5 shows an example of how a special procedure may be developed to manufacture such patterned substrates.

To precisely control the size and shape of a dried droplet, and to increase the droplet volume without increasing the diameter of the dry residue, the surface of a substrate (e.g., glass) may be patterned in plasma. Patterning may create an array of circular hydrophilic areas of a predetermined size and shape on a hydrophobic surface. FIG. 5 shows an example of how a special procedure may be developed to manufacture such patterned substrates.

In FIG. 5, the glass surface (e.g., microscope slide) is first cleaned for 20-30 sec in plasma at air pressure (0.3-0.7 Torr) at 30 W. The plasma may be cold rf plasma. The glass surface is then placed into a vapor of dimethyldichlorosylane (DDS) for 7-10 min. To keep the gas phase free of water vapor in this stage, a plastic bag was filled with nitrogen, which passed over a droplet of DDS. After removing from the bag, the glasses were placed for 1-2 hours into an oven heated to 100-120° C. to bake the hydrophobic layer. Baking should stabilize the hydrophobic layer.

The glass may then be covered with a mask manufactured from a perforated aluminum plate (e.g., Small Parts) is tightly pressed against the silanized surface. The mask may contain an array of holes, 1.5 mm in diameter, with a distance between the holes of 3 mm. The polished side of the aluminum mask faced the glass surface. The mask was pressed against the slide with binder clips. The surface is treated in the same plasma discharge for 5-7 sec to remove the hydrophobic coating from the areas exposed through the holes in the mask. The rest of the surface remained hydrophobic. In some experiments plastic substrates were used. In these cases, the silanization procedure may be omitted.

4. Preparation of Reporters

Amino acids were dissolved in ultrapure water, and the pH of the solutions was adjusted to 6.8-7.1 with NaOH or HCl solutions.

Applying Droplets

Generally, droplets can be applied from a micro-syringe or a micro-pipette, one at time. However, such simple technique may be time consuming.

Figure 6:
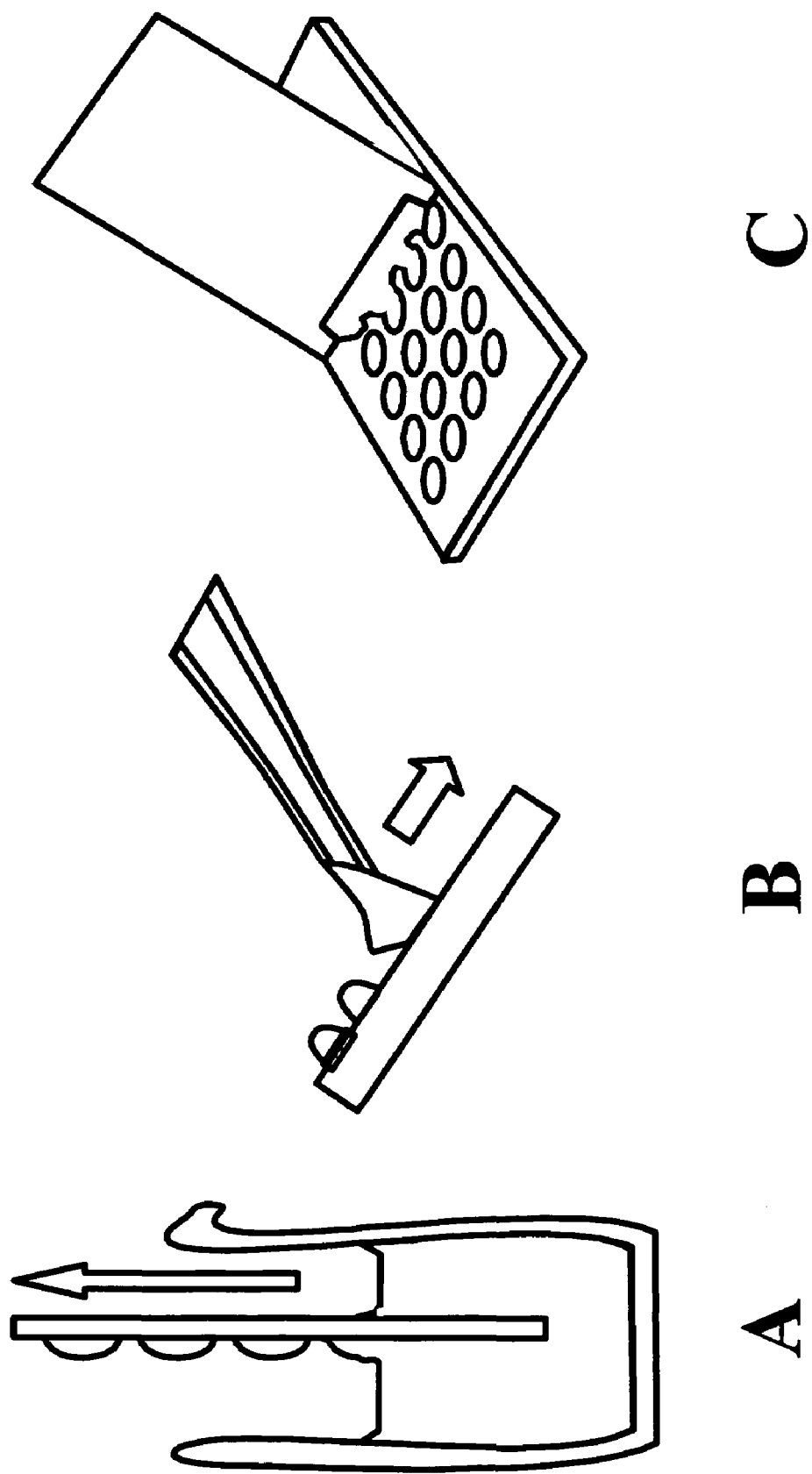
FIG. 6 shows a method for depositing arrays of droplets.

Thus, in lieu of the above technique, other methods may be used. Three methods of depositing arrays of droplets have been successfully tested with the patterned glass and polymer supports. In the first one, shown schematically in FIG. 6, substrate is dipped into a solution and then slowly withdrawn. In the second technique depicted in the FIG. 6, a large droplet of solution is poured onto a slightly declined substrate and dragged downhill by a pipette tip, leaving behind a line of droplets. Finally, a special smearing plate was used to drag a solution. To avoid damaging the patterned substrate part of the plate edge was removed, as seen in the FIG. 6.

Figure 7:
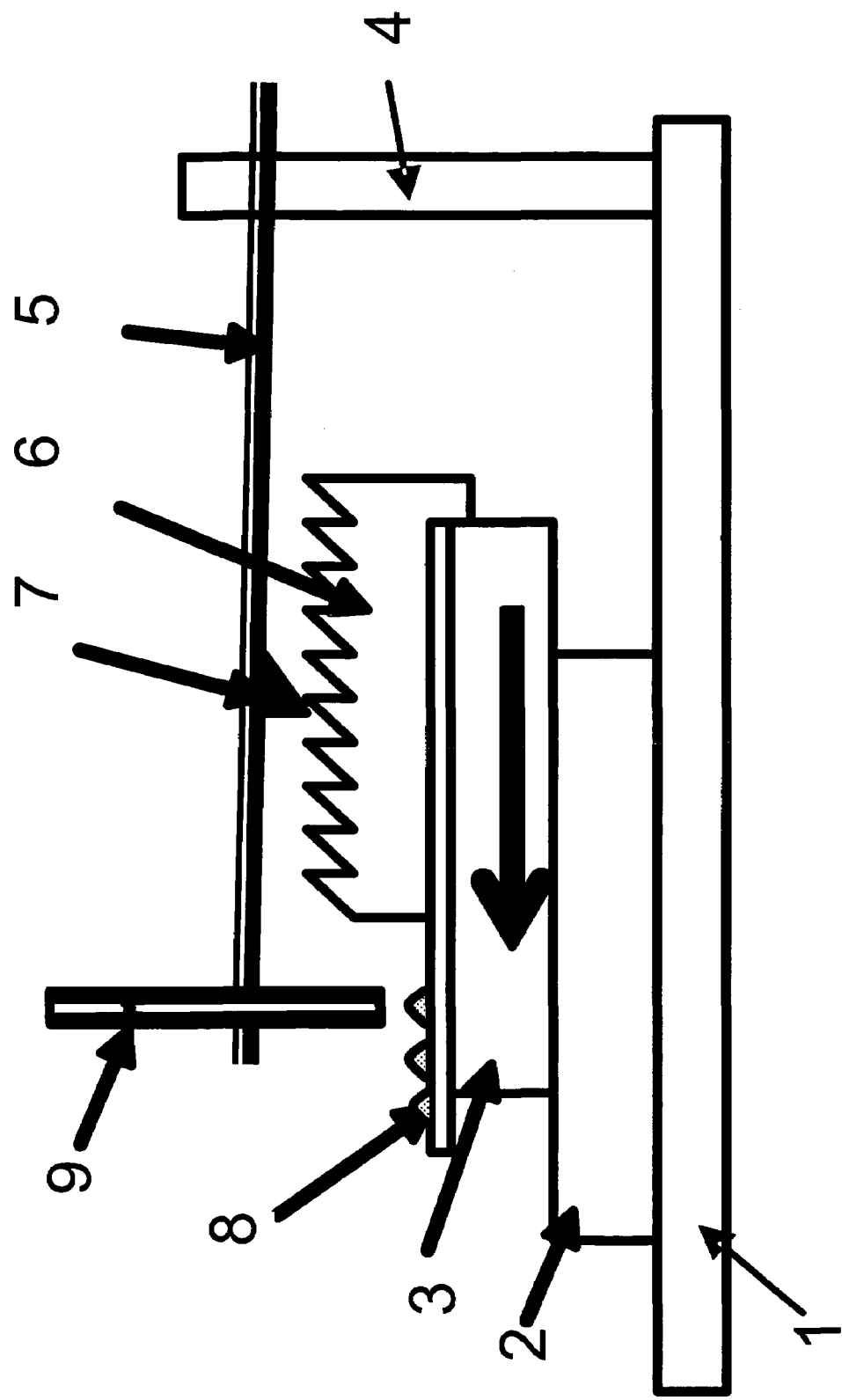
FIG. 7 shows a semiautomatic device.

Consider the following exemplified deposition method. A 10 mg/mL amino acid solution was mixed with an equal volume of dialyzed protein solution. Water was substituted for the protein solution in control. Microdroplets of both solutions were deposited onto hydrophilic spots on the patterned microscopic slide with either a Hamilton microsyringe or a capillary array. In the latter case, a semiautomatic device schematically presented in FIG. 7 was used. FIG. 7 shows a schematic of a semiautomatic applicator for rapid manufacturing of droplet arrays. It includes a base; stationary base of the linear motion ball bearing slide; top slide; capillary holder; reed; ratchet plate; tooth; patterned microscope slide and solution capillaries.

The patterned slide was fixed onto a linear motion ball bearing slide (e.g., Edmund Scientific) and a row of eight capillaries, 1.57 mm o.d. and 40 mm long, was attached to a flexible reed so that slight tapping of the reed caused the capillary tips to touch the slide within the hydrophilic spots and deposit small droplets, approximately 0.4 μL in volume. Capillaries were filled manually by placing 20 μL of solution from a pipette tip into each capillary. Each slide included an array of control droplets where water was used in place of the protein solution.

The device was placed into a jacket to protect it from dust and air flow. A motor steadily moved the top slide and induced oscillatory vibrations in the reed via contact of the tooth with the ratchet. Each time the capillary end touched the slide within the hydrophilic area, a microdroplet was released and filled the entire hydrophilic spot. This technique allowed deposition of 18 droplets of 8 different mixtures onto one microscopic slide. The deposition itself took 5 sec and produced the array of microdroplets. No drying of microdroplets was observed during the deposition.

It is well recognized that any other known method can be employed to fabricate array of reporter droplets (e.g., automatic apparatus for droplets production method manufactured by Symex Technology Corp., San Jose, Calif.

Mixing Analyte Solution with Reporter Solutions

1. Example 1

Analyte solution may be pre-mixed with a reporter solution. The mixture may be distributed in a series of droplets over substrate surface. Droplet volume may be selected at 0.2-0.4 μL.

2. Example 2

Figure 8:
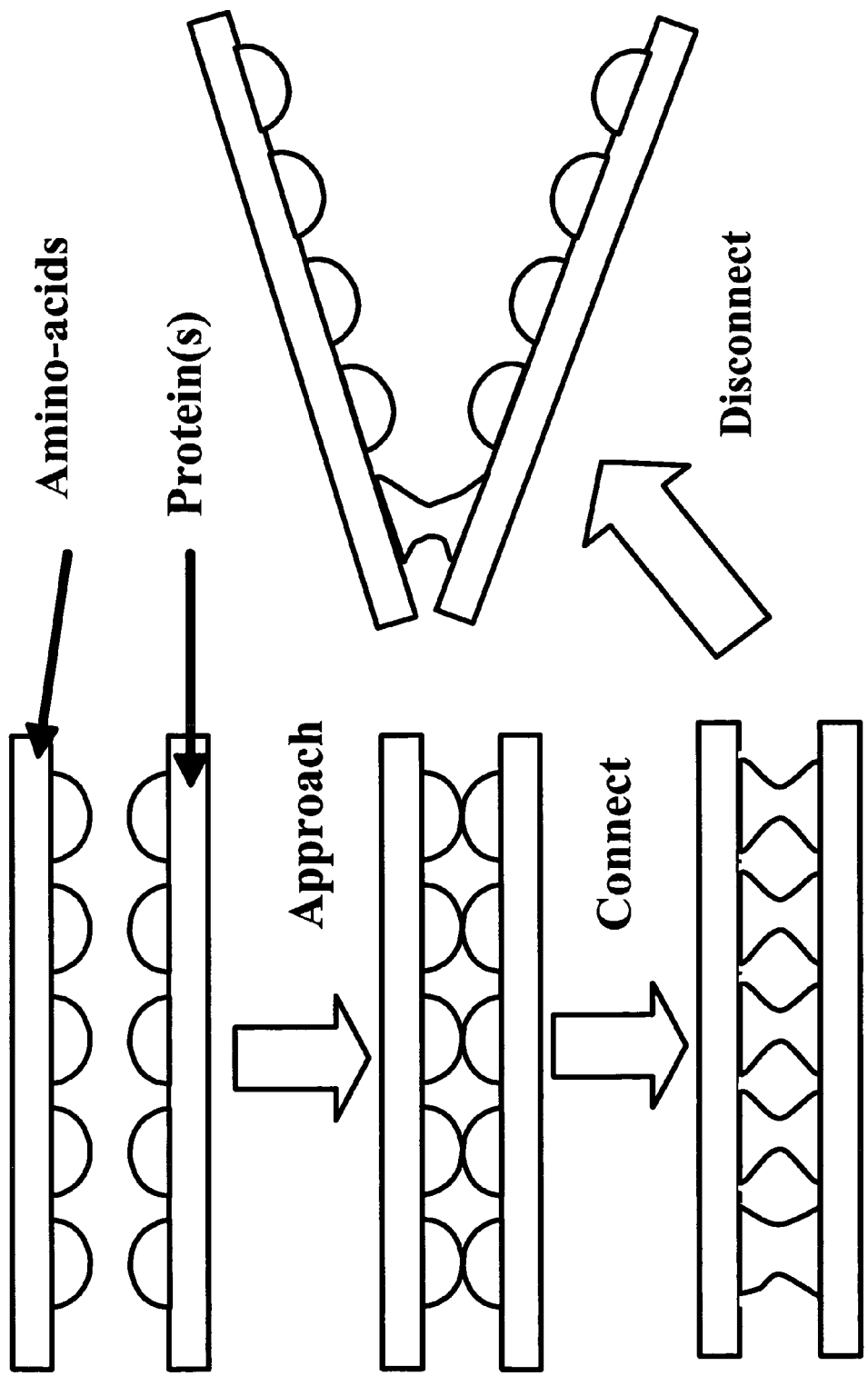
FIG. 8 shows an example of a complex procedure of mixing analyte and reporters solutions in parallel.

A more complex procedure of mixing analyte and reporters solutions in parallel is exemplified in FIG. 8. Two slides, one containing an array of amino acid droplets solutions and the other containing array of droplets of analyte solutions, may be brought together until the droplets made contact. A spacer may be placed at the edge of the slides to maintain a specified gap. The solutions may be allowed to mix for a few minutes before separating the slides and placing the slides into a drying chamber.

In one variant of this technique, droplets of amino-acids solutions may be allowed to dry before contact with array of analyte solutions. In doing so, dry amino-acids may dissolve and mix with the analyte solutions quickly. A result is that the final pattern may be very similar to that obtained upon direct mixing the solutions.

3. Example 3

Other techniques may be used to add the analyte solution to an array of reporter droplets. One example is spray deposition on the array of droplets or dry residues of reporters. In this technique, analyte solution can be sprayed over the surface of a substrate with an array of reporter solutions. Spraying may introduce identical amounts of analyte into each reporter droplet.

Another example is electrospray deposition on the array of reporters. This technique is a modification of the previous procedure in which spraying and deposition is controlled by electrostatic forces. This technique may prevent the loss of analyte sample.

Yet, another example is addition through a dialysis membrane. In this technique, for the analyte molecules with a molecular mass too high to penetrate through an ultra-filtration membrane, reporter molecules (which tend to have a relatively smaller molecular mass) can be added via dialysis.

Reporter-Assisted Analyte Recognition

1. Protocol 1

One protocol may involve identification. Identification is based on recognition of a typical pattern produced in the reporter in the presence of a particular analyte. To realize this protocol a large library of images of reporter patterns may be collected. The library may include patterns for all variety of analytes to be tested. All the patterns may be obtained under identical and well preserved conditions of drying. The library may also include data on the pattern changes resulting from variations in the analyte concentration. Recognition procedure may then be realized by comparing sample patterns with all the patterns from the library to find similarities.

2. Protocol 2

In another detection protocol, analyte under analysis may be mixed with solutions of a number of different reporter compounds. Images of drying patterns from droplets of the pure reporters are then compared with the images of the same reporter solutions with the added toxin as schematized in FIG. 4. No library of images is necessary, comparison of pairs of images obtained simultaneously requires simpler software and less sophisticated hardware is needed to control the drying process.

Drying Droplets

In one embodiment, the microdroplet slide may be quickly transferred into a dust-free closed chamber where the droplets may be dried at 25-30% relative humidity and a temperature 23° C. with no forced ventilation applied. Dynamics of droplet drying were observed by attaching another drying chamber to the microscope platform of the Axiovert 25 Zeiss microscope. The time of drying may vary between 3 and 10 min for different amino acid solutions depending on the water activity in the solutions.

In another embodiment, a standard commercial climatic camera may be adapted to dry arrays of droplets under well controlled conditions. It may be equipped with (i) a fan to support air flow, (ii) an infra-red lamp to provide control of temperature, and (iii) humidity, air-flow and temperature meters to measure and adjust the most important parameters involved in drying. Drying at 30% humidity, 38° C. with air flow of 0.8 m/min droplet having a volume of 0.4 µL may dry in approximately 4-5 minutes.

In yet another embodiment, a small closed plastic box may be placed on the table of an inverted microscope. Inlets and outlets placed on the opposite sides of the boxes allowed to flow air through the box. To establish a laminar flow of the air inside the chamber, layers of foamed plastic were placed between outlets and the internal space of the chamber. The chamber may be connected to a membrane pressure pump which allow a continuous circulation of the air. To control humidity, the air may be pumped through a chamber with wet salt (e.g., $Na_2SO_4$, etc.). A hygrometer may be used to measure humidity of the circulated air.

Further nonlimiting examples provided below are intended for clarification purposes only.

1. Example 1—Amino Acids as Reporters

Droplets were formed on the glass slides in one of three ways, as depicted in FIG. 5.

Figure 9:
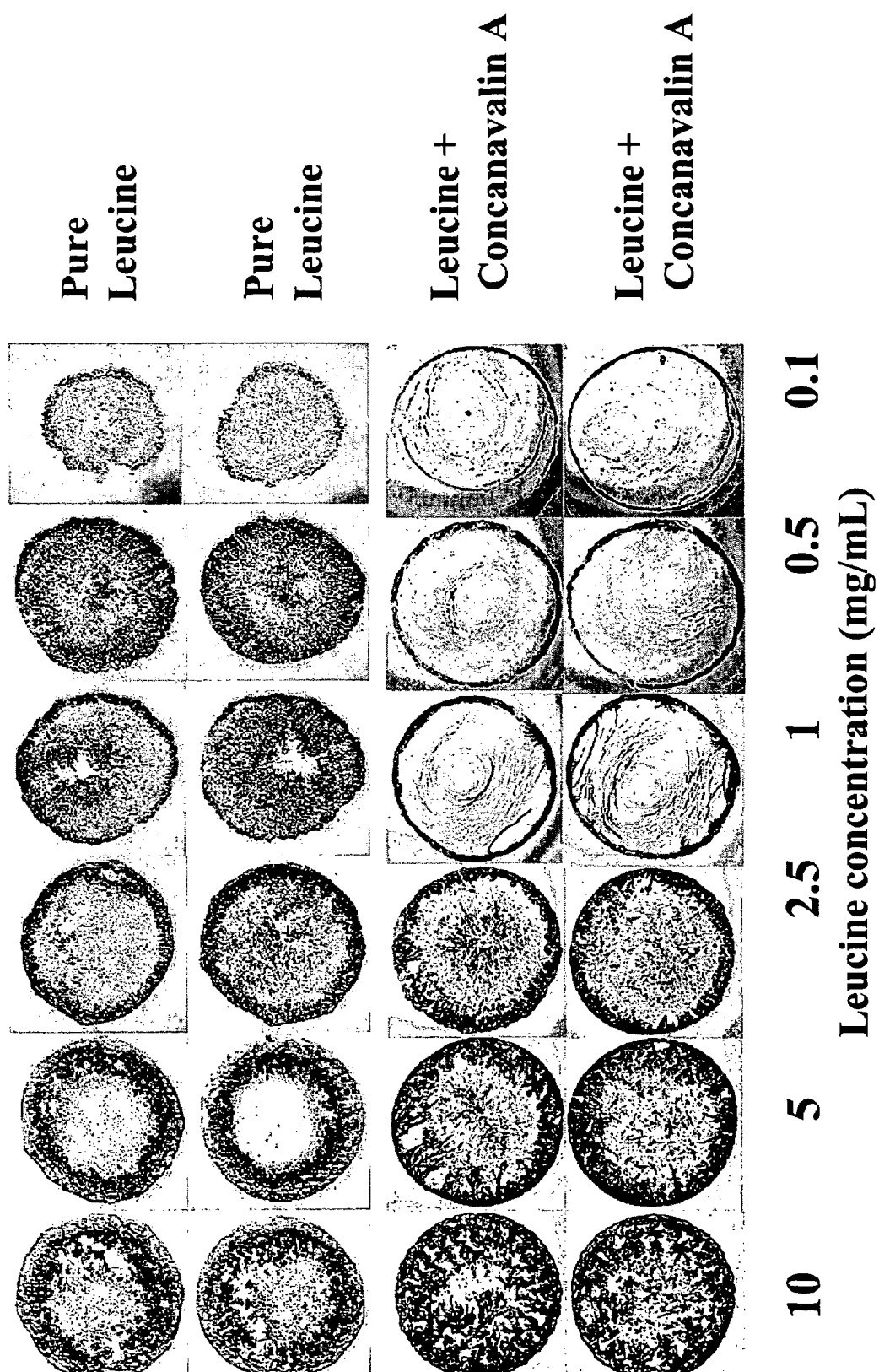
FIG. 9 shows an example of determining the optimal amino acid concentration.

A typical experiment with the aim of determining the optimal amino acid concentration is presented in FIG. 9. A comparison of images in the first two rows shows that reporter drying patterns are quite reproducible for any given concentration and that they are different at each reporter concentration. Addition of concanavalin A at a concentration of 50 µg/mL results in notable changes of the patterns at all amino acid (leucine) concentrations. However, the patterns at higher concentrations (0.5-5 mg/mL) reveal more details that may be useful for comparison.

Five different proteins have been tested for their effects on the drying patterns of 12 different amino acids. All the amino acids were obtained from Sigma-Aldrich. Proteins were extensively dialyzed to remove buffer and salt components present in all the commercial protein samples. Concentrations of dialyzed proteins were measured by the quartz crystal micro-balance method.

Figure 10:
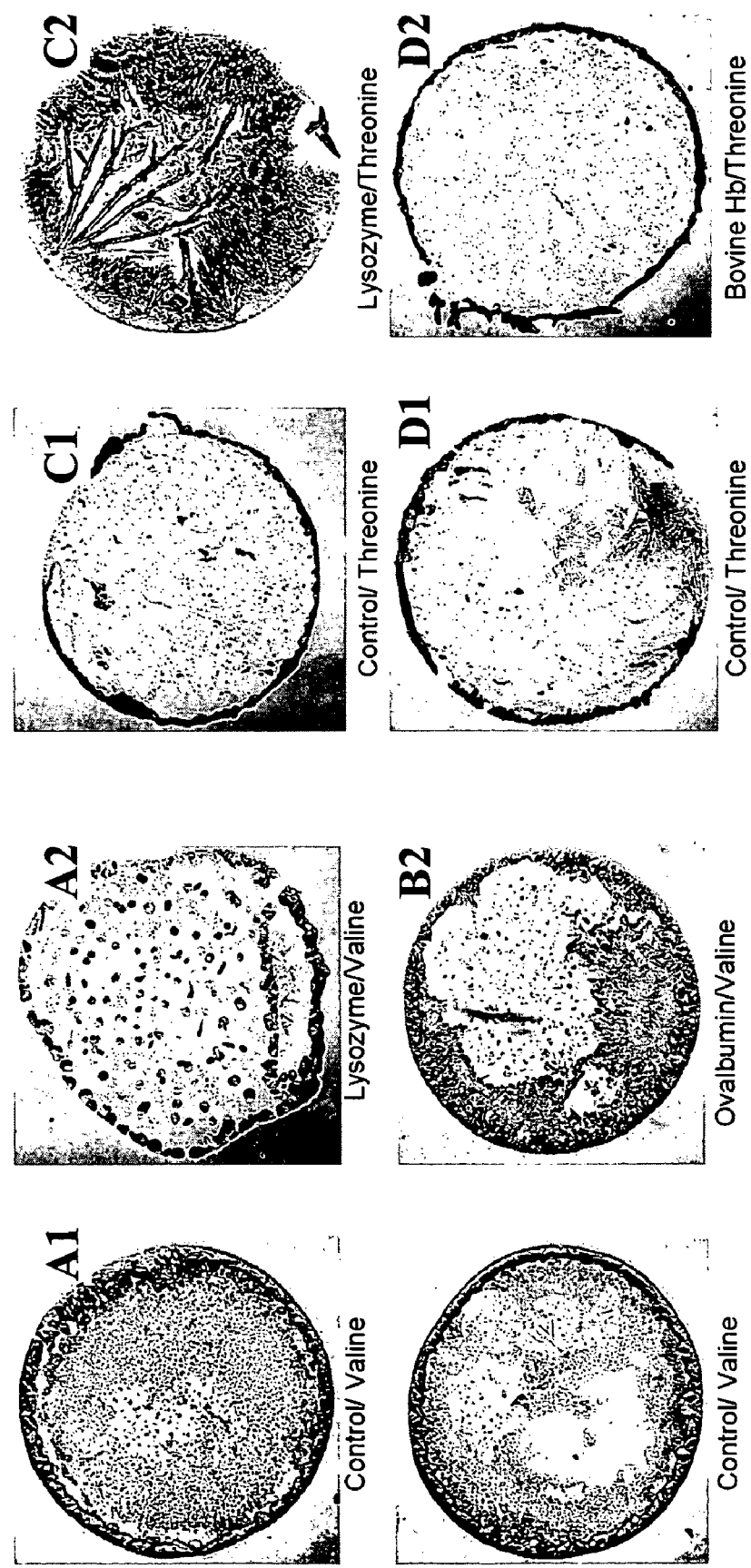
FIG. 10 shows an example of drying patterns of pure reporter amino acids and of the same amino acids to which small amount of three different proteins was added.

Drying patterns of pure reporter amino acids and of the same amino acids to which small amount of three different proteins was added are presented in FIG. 10. It can be seen that lysozyme drastically changes the dry patterns of valine and threonine. However, bovine hemoglobin taken at the same concentration does not produce notable changes in the threonine drying pattern. Thus, the addition of some proteins in the amount of approximately 100 pg may dramatically change the drying patterns of some reporters while leaving patterns of other reporters unchanged.

Table 1 summarizes the results of screening the effects that five proteins have on drying (crystallization) patterns. Each protein affects a certain unique set of reporters. BSA, known for its ability to bind a variety of metabolites and drugs, affects crystallization patterns in more than half of the amino acids tested.

The screening results presented in Tables 1 and 2 show that analysis of pattern changes in an array of different reporters allows one to recognize pure proteins with high specificity, even when the latter are taken at a relatively low concentration. It is expected that the recognition capacity of the 12 reporter substances used here is far beyond the limited number of the proteins tested.

$2^{12}$ Theoretically, a binary code of 12 amino acids provides $2^{12}$ (or 4,096) different combinations of ones and zeros. While it is possible that some codes may be redundant, redundancy does not seem to pose a serious theoretical problem since the number of independent reporters could be easily increased to approximately 100, thus yielding approximately $10^{30}$ unique binary codes. It is practically quite feasible to extend the number of reporters to 100, which potentially gives approximately $10^{30}$ combinations. The total variety of all possible antibodies (estimated from all gene combinations) as 17 billion corresponds to a combinatorial capacity of a 35 reporter binary code. Though many of these compounds are insoluble in water, reactive to protein molecules, or otherwise unsuitable for use as the reporters, still a considerable fraction of the compounds may satisfy the reporter conditions.

requires neither complex physical devices (spectrophotometer, mass spectrometer), nor fragile biochemical molecules to recognize analytes.

This example illustrates a new principle of recognition of analytes based on their interference with crystallization/precipitation of a series of molecules of low molecular weight used as reporters. Each protein can be characterized amounts by a unique "code."

2. Example 2—Device Concepts Based on Reporter Coding

Figure 11:
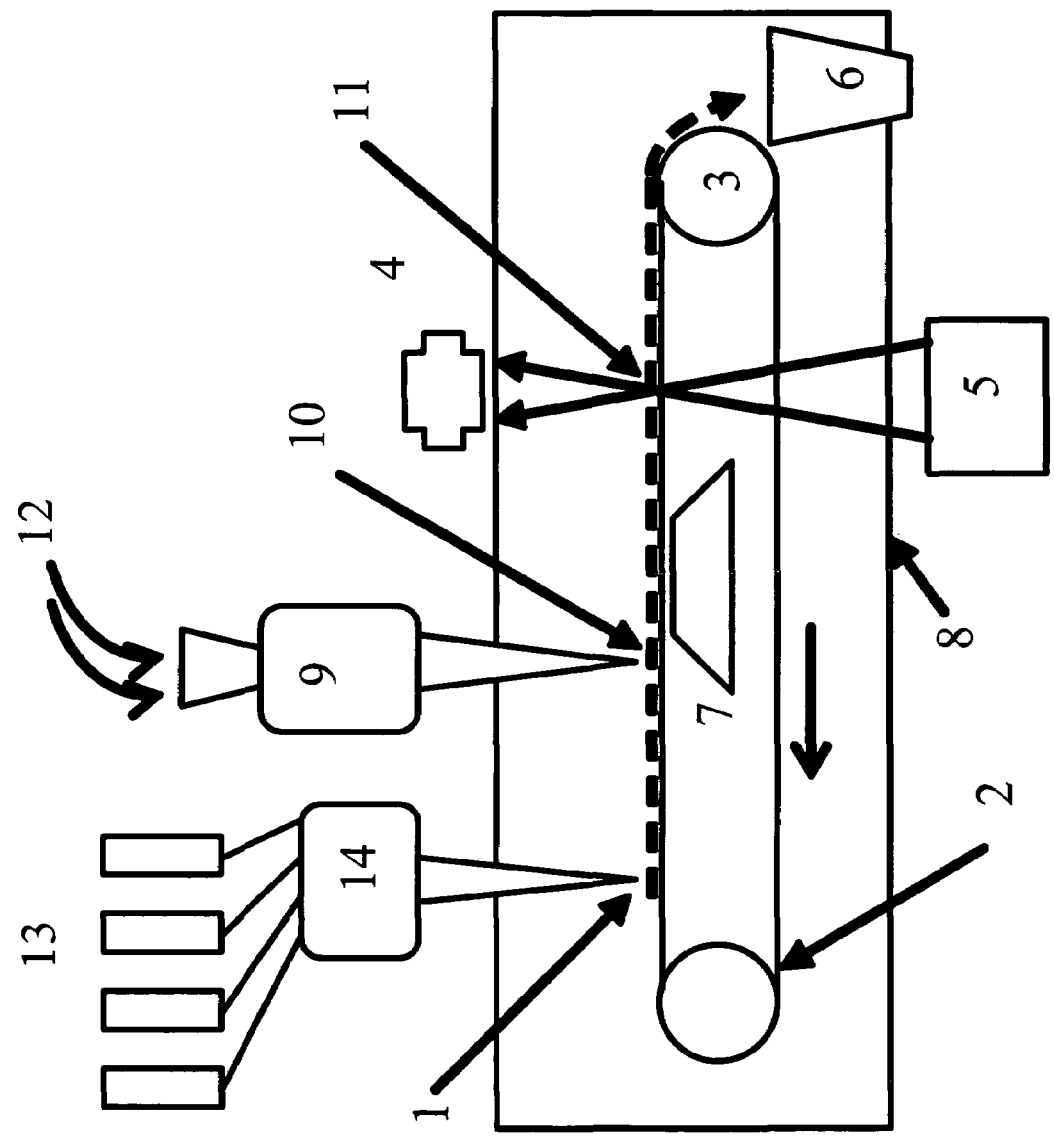
FIG. 11 shows an example of an apparatus.

Different embodiments of an apparatus may be realized. FIG. 11 schematizes one of them. A liquid sample may be obtained by collection of aerosol into pure water. After filtration and dilution, it may be mixed with a series of

TABLE 1

Effect of different proteins on crystallization of 12 amino acids

| Proteins/ Amino acids | Leu (L) | Val (V) | Ala (A) | Thr (T) | Pro (P) | Met (M) | Asn (N) | Gln (Q) | Lys (K) | Ser (S) | Phe (F) | His (H) |
|---|---|---|---|---|---|---|---|---|---|---|---|---|
| Ovalbumin | – | ++ | ++ | ++ | –– | + | – | –– | – | –– | + | + |
| *Bovine* Hb | + | –– | ++ | – | ++ | + | –– | + | — | –– | + | ++ |
| HEWL | – | ++ | –– | ++ | –– | –– | –– | –– | ++ | ++ | – | + |
| Con A | ++ | –– | –– | –– | ++ | – | ++ | –– | ++ | ++ | – | + |
| BSA | ++ | –– | – | ++ | + | ++ | ++ | ++ | ++ | ++ | + | + |

In this example, protein droplets are deposited over dried amino acids. Droplet volume is 0.4 μL, with 100 pg of protein per drop. Amino acid concentration is 5 mg/ml.
"++" denotes very notable effect like those illustrated in FIG. 10.
"––" denotes negligible effect.
"+" and "–" denotes "rather different" and "rather similar" patterns, respectively.

TABLE 2

Presentation of the data describing effects of proteins on crystallization patterns of amino acids as "binary codes."

| Protein | "Binary code" | | | | | | | | | | | | Number of amino acids affected |
|---|---|---|---|---|---|---|---|---|---|---|---|---|---|
| | L | V | A | T | P | M | N | Q | K | S | F | H | |
| Ovalbumin: | 0 | 1 | 1 | 1 | 0 | 0 | 0 | 0 | 0 | 0 | 0 | 0 | 3 |
| Hemoglobin (bovine): | 0 | 0 | 1 | 0 | 1 | 0 | 0 | 0 | 0 | 0 | 0 | 1 | 3 |
| Hen egg white lysozyme | 0 | 1 | 0 | 1 | 0 | 0 | 0 | 0 | 1 | 1 | 0 | 0 | 4 |
| Concanavalin A | 1 | 0 | 0 | 0 | 1 | 0 | 1 | 0 | 1 | 1 | 0 | 0 | 5 |
| Bovine serum albumin | 1 | 0 | 0 | 1 | 0 | 1 | 1 | 1 | 1 | 1 | 0 | 0 | 7 |

In Table 2, a binary code of "1" is used for amino acids whose patterns are strongly affected by addition of 100 pg of a protein into a droplet of the amino acid solution. A binary code of "0" is used when the effect is negligible.

The reporter method may present a new approach in the recognition of chemical and biochemical substances to the two currently known approaches. In one current approach, spectral characteristics of substances, their masses, or the interaction of substances with a solid surface (e.g., in columns) is used to recognize molecules. This approach requires a library of available spectra or the addition of an authentic sample to the analyzed solution before the separation. In another common approach, specific recognition molecules are borrowed from biological organisms or manufactured by using the biosynthetic machinery of a living cell. This approach provides a basis for immunoassay analysis and for genomic methods based on hybridization of complementary DNA strands. A major disadvantage of such current methods is connected with the instability of biological recognition molecules. The reporter method described here solutions of reporter compounds. The mixture may be distributed as array of droplets (e.g., 0.1-1 μL) onto a transparent slide or tape. In parallel a reference solutions may be arrayed. The latter may include a mixture of the reporter solutions with pure solvent or a control solution. The control solution should be identical to the analyte solution but lacking the analyte. After drying images may be acquired for patterns of each reporter in the presence and in the absence of analyte. Images may be compared by an operator or by an automatic system. The level of the differences among different reporters as the signature of analyte may be scored. A database for a set of analytes may be created, which may describe the sensitivity of patterns for a given set of reporters for each particular analyte.

Figure 12:
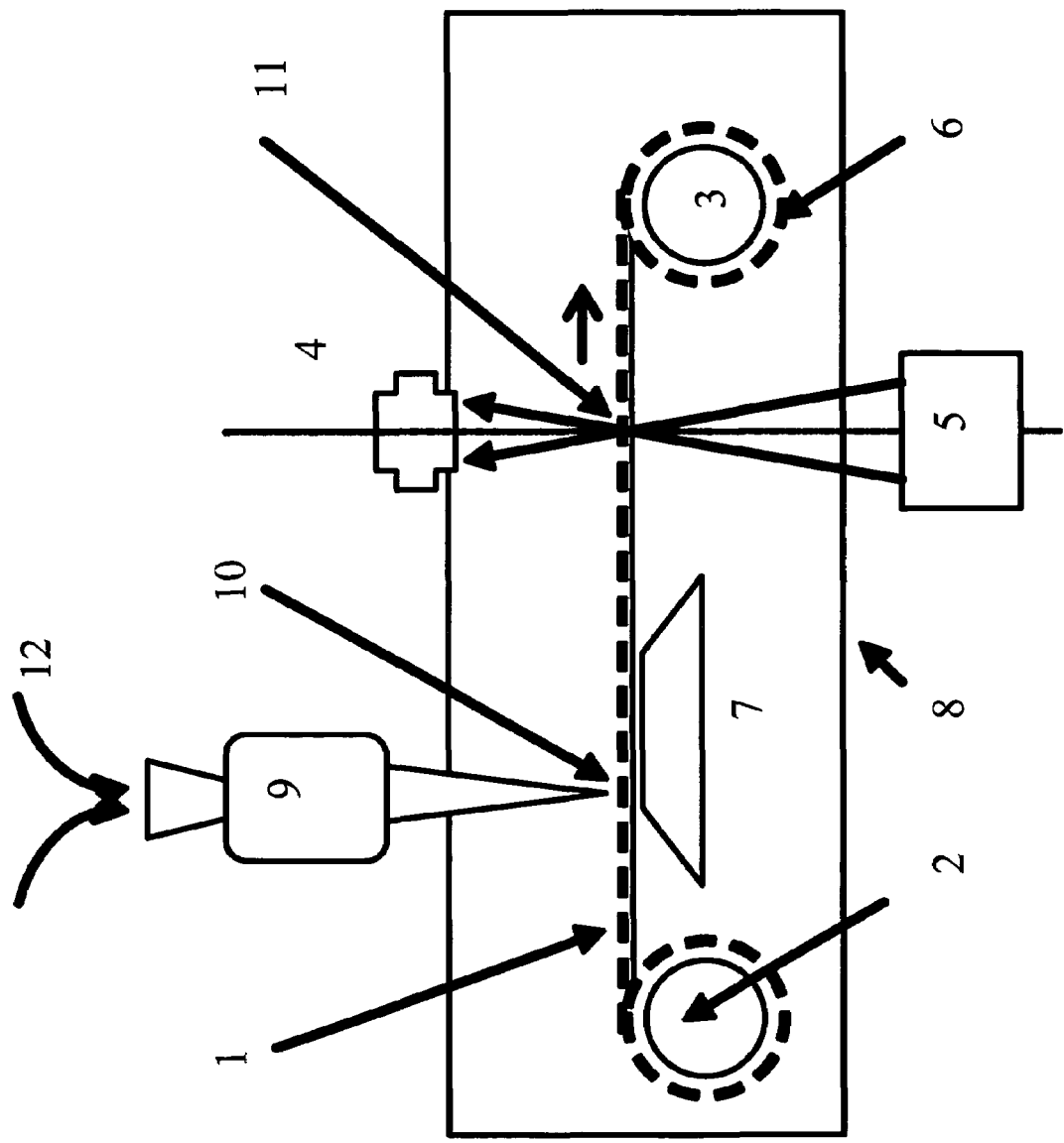
FIG. 12 shows an example of depositing reporter molecules as an array of dry spots on a roll of film.

In another embodiment, as illustrated in FIG. 12, reporter molecules may be deposited as an array of dry spots on a roll of film. Droplets of analyte and the reference solutions may be deposited into predetermined positions over the dry reporter spots. They may be stirred to dissolve the reporter. After stirring, they may be mixed by a vibrator dried under well controlled conditions when the substrate is slowly pulled through a drying chamber. When the dry patterns reach the CCD camera, their images may be captured. The patterns may be compared and analyzed as described above.

3. Drying/Crystallization Pattern

Formation of a DCP is a complex phenomenon to which both macroscopic and microscopic events in the drying droplet may contribute. One DCP feature that often (but not always) changes in response to protein addition is the ringlike deposit along the droplet perimeter seen in FIGS. 13 and 14.

Figure 13:
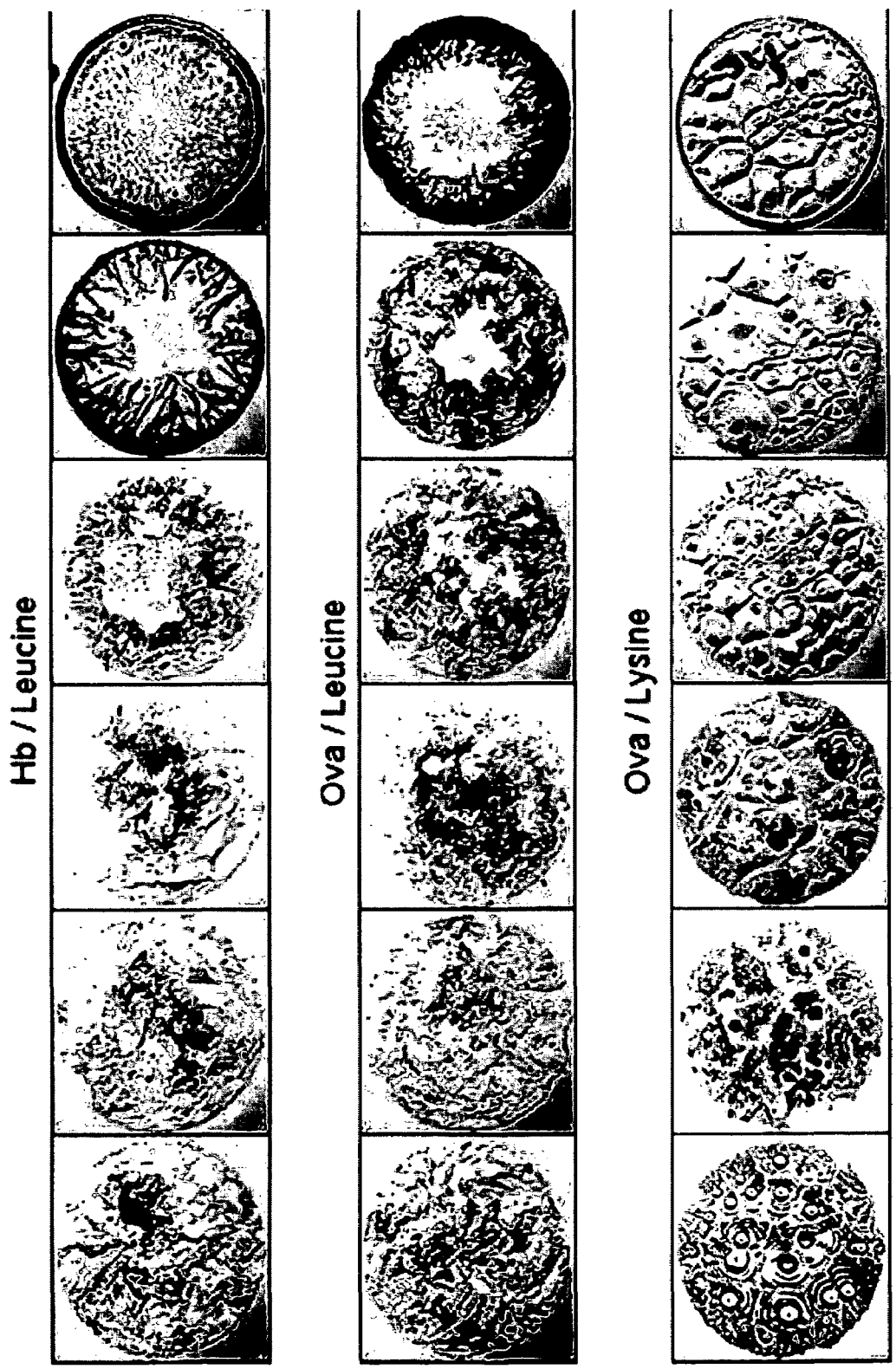
FIG. 13 shows a formation of a DCP.
Figure 14:
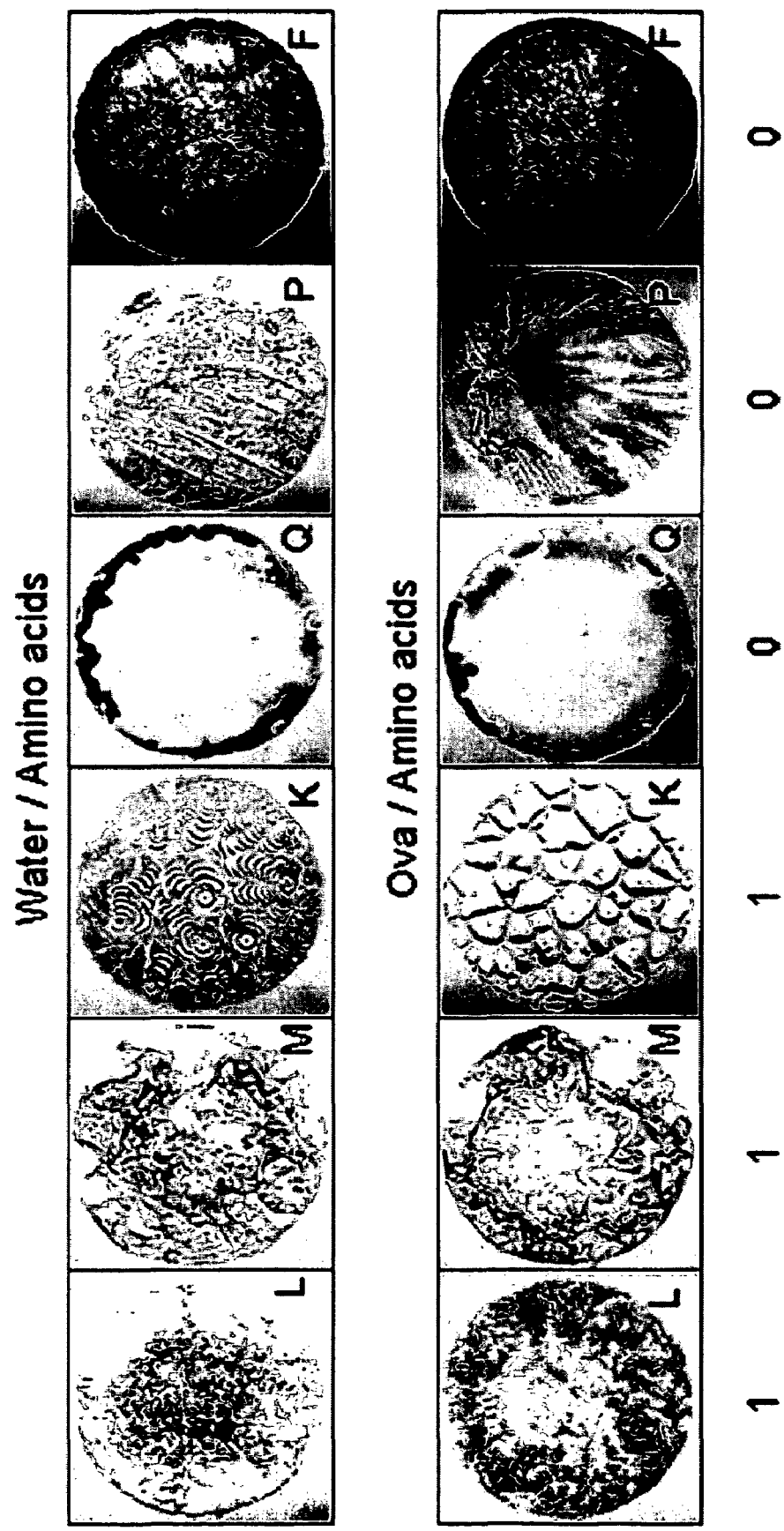
FIG. 14 shows another formation of a DCP.
Figure 15:
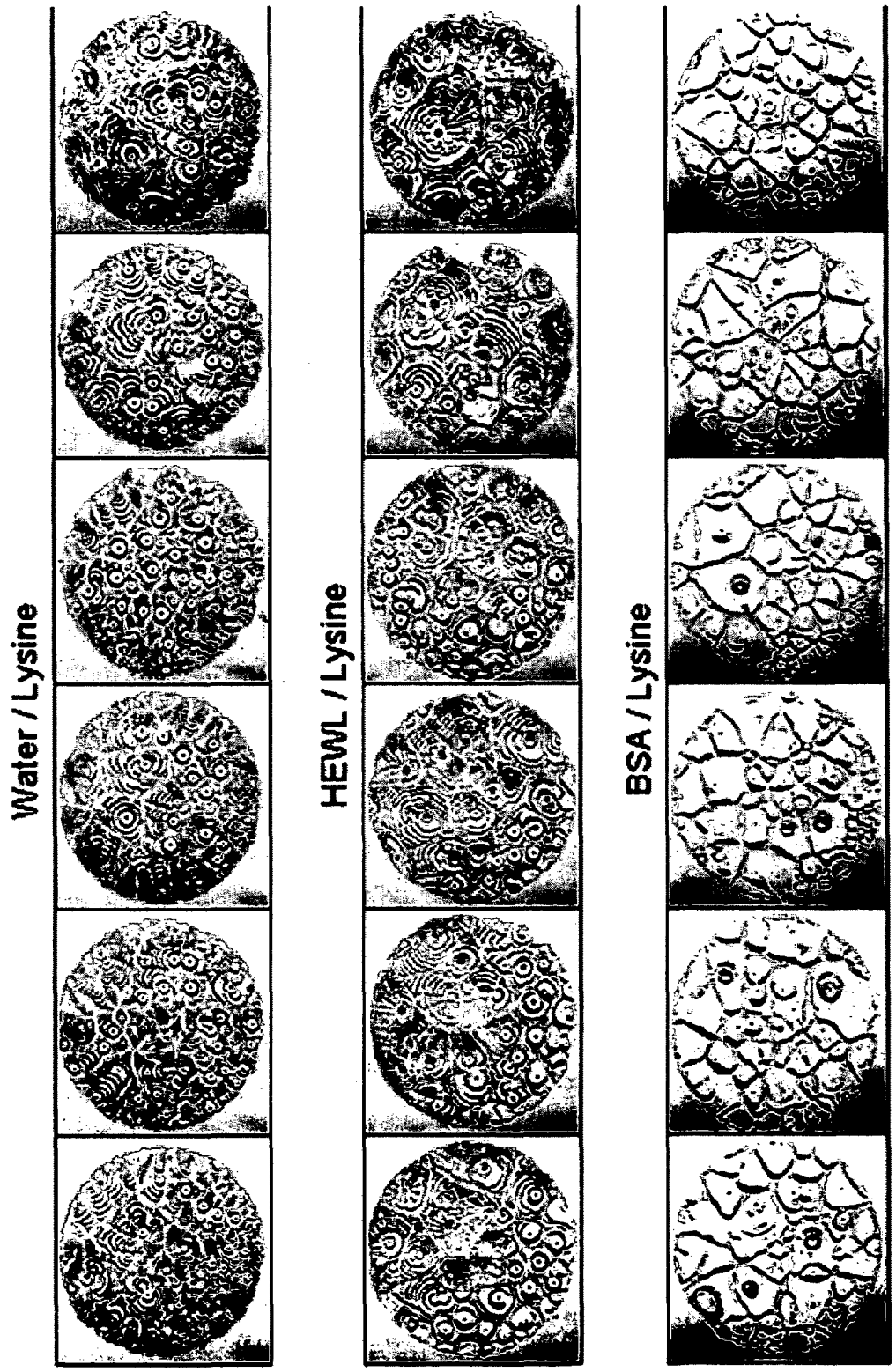
FIG. 15 shows an illustration of the typical variability observed in control DCPs and in the DCPs of reporter/protein solutions.

FIG. 13 shows examples of changes in the DCP of amino acid solutions resulting from addition of proteins at different concentrations. Each 0.4-µL droplet contains a 1/1 (v/v) mixture of the 10 mg/mL amino acid solution and water (control) or protein solution. From left to right: water (control), protein added in concentration of 0.0003, 0.003, 0.03, 0.3, and 3.0 mg/mL. Droplets were deposited with the semiautomatic applicator shown in FIG. 7. Droplets dried within 3-5 min. Diameter of each DCP is 1.5±0.02 mm.

FIG. 14 shows an example of binary coding of a protein using DCP in an array of droplets of reporter amino acid solutions. Each 0.4-μL droplet contained amino acids at a concentration of 5 mg/mL, and 100 pg of Ova was added to each amino acid solution. The letter in the lower corner of each image denotes a one-letter abbreviation for amino acid: L, leucine; M, methionine; K, lysine; Q, glutamine; P, proline (trans-4-hydroxy) analogue; and F, phenylalanine.

The ringlike deposition may result from enhanced evaporation of solvent near the highly convex edge. If reporter crystallization happens at an early stage of drying and the crystals are formed in the bulk solution, they may be transported by the capillary flow to the droplet edge and concentrated there, forming a ring. Protein added to the droplet can affect this process in several ways: (i) by inhibiting formation of crystals until higher levels of supersaturation may be achieved at later stage of drying, at which time the solution layer may be too thin to transport crystals; (ii) by inhibiting evaporation from edges due to accumulation of the protein at the periphery; (iii) by increasing solution viscosity; (iv) by blocking the crystallization centers on the glass support; and (v) by more effective immobilization of newly formed crystals on the glass substrate. The first three factors are expected to make DCP more uniform, while other two may result in formation of ringlike deposits.

One of the significant advantages of using patterned arrays is that all droplets may be contained in areas of the same size, and thus may eliminate the effect of droplet size on the crystallization pattern. In the absence of a patterned array surface, the final size of the DCP may depend on the solution surface activity. Taking into account that all proteins are capable of concentrating at the waterair interface, thus changing the solution surface tension, one may expect such nonspecific changes to occur in DCPs for most protein additives.

In addition to the radial distribution of the reporter, proteins may affect other DCP features. Thus, for example, Hb may promote formation of large Leu crystals that concentrate on the droplet periphery (FIG. 13). While Ova may also promote formation of Leu crystals, their irregular morphology may drastically differ from the elongated crystals radially growing from the edges in the presence of Hb. In contrast to the positive effect of Ova on Leu crystallization, the effect of Ova on Lys crystallization may be inhibitory: the rotation of polarized light in the Lys/Ova DCP may be dramatically reduced.

Increasing the solute concentration upon drying may initiate and may support all kinds of processes leading to association of the solutes (e.g., aggregation, gelatination, crystallization, etc.). The concentration and identity of the components, solution viscosity, ionic force, presence of surfactants, and presence of gel- and crystal-forming molecules can all potentially affect the DCP.

It is known in the art that the drying of the same multi- or mono-component liquid under identical conditions may also result in reproducible morphological patterns, whereas the slightest variation in the composition of a liquid may change the patterns. Changes in the dry patterns of saliva and blood plasma have been documented, for example, in sick patients. Acustomechanical impedance measurements may be used to monitor dynamic processes in a drop drying on a quartz crystal resonator. This method may tested using plasma, urine, and saliva from sick and healthy people.

However, instead of relying on specific changes in the mechanical properties of the drying drop or specific features in the crystal pattern as analyte signatures, this disclosure determines signatures by observing effects of the analyte on the DCP in multiple reporter solutions.

Binary Codes

1. Protein Binary Code from Amino Acid DCPs

The series of images in FIG. 13 illustrate how proteins affect the DCP of amino acid solutions. When compared with control images in which water was added instead of protein solution, the affect of a protein on the DCP may be dependent on concentration. Although DCPs may change with increasing protein concentration, they tend to remain different from control DCPs. FIG. 14 illustrates the differences in DCPs of several amino acids in response to the addition of 100 pg of Ova. It can be seen that Ova changes the DCP of Leu, Met, and Lys, while the DCP of three other amino acids (i.e., Gin, Pro, Phe) are only minimally affected and mimic the variations seen in control DCPs.

Though one may be able to create a database containing all of the observed DCP modifications caused by a series of proteins for every reporter substance, the resulting database may be unwieldy in size and may require that all control and test samples be prepared under standard drying conditions. A simpler approach involves determining only whether the DCP changes due to the presence of a particular protein while ignoring the specific details of the change. Such changes may be easily recognized despite slight variabilities in DCPs. FIG. 15 presents an illustration of the typical variability observed in control DCPs and in the DCPs of reporter/protein solutions. Despite minor variability in DCPs of individual droplets, a conclusion can be made that DCPs of Lys/HEWL are almost identical to those of controls, while DCPs of Lys/BSA are notably different from the control DCPs.

A value of "0" may be assigning the amino acids displaying no or small changes. Those that show drastic unambiguous changes in the DCP may be assigned a value of "1." Both values may yield a "binary" code for each of the proteins tested at equal (w/v) concentrations.

Similar to Table 2, Table 3 summarizes results from analyzing the effects of 5 proteins on DCPs of 12 different amino acids in terms of the binary code. It is seen that the addition of 100 pg of protein may result in substantial DCP changes in 3-9 reporters. BSA, known for its ability to bind to many ligands in serum, affected the DCP of 9 out of the 12 amino acids studied.

TABLE 3

Presentation of the Data Describing the Effect of Proteins on Crystallization Patterns of Amino Acids as a "Binary Code"[a]

| Protein[b] | L | V | A | T | P[c] | M | N | Q | K | S | F | H | Number of Amino Acids Affected |
|---|---|---|---|---|---|---|---|---|---|---|---|---|---|
| Ova | 1 | 1 | 1 | 1 | 0 | 1 | 1 | 0 | 1 | 0 | 0 | 1 | 8 |
| Bovine Hb | 1 | 1 | 1 | 0 | 1 | 1 | 1 | 0 | 1 | 0 | 0 | 0 | 7 |
| HEWL | 0 | 1 | 0 | 0 | 0 | 0 | 0 | 0 | 0 | 1 | 0 | 1 | 3 |
| Con A | 1 | 1 | 1 | 1 | 1 | 0 | 0 | 1 | 0 | 0 | 1 | 0 | 7 |
| BSA | 1 | 1 | 1 | 1 | 1 | 0 | 1 | 1 | 1 | 0 | 1 | 0 | 9 |
| Ova + Bovine Hb | 1 | 1 | 1 | 1 | 1 | 1 | 1 | 0 | 1 | 0 | 0 | 1 | 9 |
| Con A + BSA | 1 | 1 | 1 | 1 | 1 | 0 | 1 | 1 | 1 | 0 | 1 | 0 | 9 |
| HEWL + Bovine Hb | 1 | 1 | 1 | 0 | 1 | 1 | 1 | 0 | 1 | 1 | 0 | 1 | 9 |

[a]denotes proteins that strongly affect the crystallization pattern of an amino acid are assigned a value of 1, while those showing negligible effects are assigned a value of 0. Final amino acid concentration was 5 mg/mL.
[b]denotes a 100-pg sample of protein was added to a 0.4-μL droplet of 5 mg/mL amino acid. In the case of protein mixtures, 50 pg of each protein was added to the droplet.
[c]shows that P denotes proline (trans-4-hydroxy) analogue.

2. Concentration Dependence of Binary Codes

Table 3 describes the effects of proteins present in similar (w/v) concentrations. By varying the concentration of several proteins and adding them to amino acid reporters kept at a constant concentration, the effect of protein concentration on the binary code may be determined.

concentrations, proteins tend to affect the DCP of each amino acid, which results in alcode of ones. In a concentration range of 0.01-0.3 mg/mL, the binary codes for each protein studied may be unique and may be used to identify these proteins. When dealing with a protein solution of unknown concentration, one may need to either determine protein concentration independently or test a series of protein dilutions and compare the codes generated at different concentrations with a database.

TABLE 4

Binary Codes for Different Concentrations of Four Proteins[a]

| C, mg/mL | Ova Code | | | | | | | | | | | | Hb Code | | | | | | | | | | | |
|---|---|---|---|---|---|---|---|---|---|---|---|---|---|---|---|---|---|---|---|---|---|---|---|---|
| | L | V | A | T | P | M | N | Q | K | S | F | H | L | V | A | T | P | M | N | Q | K | S | F | H |
| 0.0001 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0.0003 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0.001 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0.003 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0.01 | 0 | 0 | 0 | 0 | 0 | 0 | 0 | 0 | 1 | 0 | 0 | 1 | 0 | 0 | 0 | 0 | 1 | 0 | 1 | 0 | 1 | 0 | 0 | 0 |
| 0.03 | 1 | 1 | 0 | 1 | 0 | 1 | 1 | 0 | 1 | 0 | 0 | 1 | 1 | 1 | 1 | 0 | 1 | 1 | 1 | 0 | 1 | 0 | 0 | 0 |
| 0.1 | 1 | 1 | 1 | 1 | 0 | 1 | 1 | 0 | 1 | 0 | 0 | 1 | 1 | 1 | 1 | 0 | 1 | 1 | 1 | 0 | 1 | 0 | 0 | 0 |
| 0.3 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 1.0 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 3.0 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 9.0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

| C, mg/mL | HEWL Code | | | | | | | | | | | | BSA Code | | | | | | | | | | | |
|---|---|---|---|---|---|---|---|---|---|---|---|---|---|---|---|---|---|---|---|---|---|---|---|---|
| | L | V | A | T | P | M | N | Q | K | S | F | H | L | V | A | T | P | M | N | Q | K | S | F | H |
| 0.0001 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0.0003 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 |
| 0.001 | 0 | 0 | 0 | 0 | 0 | 0 | 0 | 0 | 1 | 0 | 1 | 0 | 0 | 0 | 0 | 1 | 0 | 0 | 1 | 0 | 0 | 0 | 0 | 0 |
| 0.003 | 0 | 0 | 0 | 0 | 0 | 0 | 0 | 0 | 1 | 0 | 1 | 0 | 0 | 0 | 0 | 1 | 0 | 0 | 1 | 0 | 0 | 0 | 0 | 0 |
| 0.01 | 0 | 0 | 0 | 0 | 0 | 0 | 0 | 0 | 1 | 0 | 1 | 0 | 0 | 0 | 0 | 1 | 0 | 0 | 1 | 1 | 0 | 0 | 0 | 0 |
| 0.03 | 0 | 0 | 0 | 0 | 0 | 0 | 0 | 0 | 1 | 0 | 1 | 0 | 1 | 1 | 1 | 1 | 0 | 1 | 1 | 1 | 0 | 1 | 0 | 0 |
| 0.1 | 0 | 0 | 0 | 0 | 0 | 0 | 0 | 0 | 1 | 0 | 1 | 0 | 1 | 1 | 1 | 1 | 0 | 1 | 1 | 1 | 0 | 1 | 0 | 0 |
| 0.3 | 1 | 1 | 1 | 0 | 0 | 1 | 1 | 0 | 1 | 0 | 1 | 1 | 1 | 1 | 1 | 1 | 1 | 1 | 1 | 1 | 1 | 1 | 1 | 1 |
| 1.0 | 1 | 1 | 1 | 0 | 0 | 1 | 1 | 0 | 1 | 0 | 1 | 1 | 1 | 1 | 1 | 1 | 1 | 1 | 1 | 1 | 1 | 1 | 1 | 1 |
| 3.0 | 1 | 1 | 1 | 1 | 1 | 1 | 1 | 0 | 0 | 1 | 1 | 1 | 1 | 1 | 1 | 1 | 1 | 1 | 1 | 1 | 1 | 1 | 1 | 1 |
| 9.0 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 |

[a]denotes the concentration of protein solution added in equal volume to each amino acid solution is indicated. The concentration of all amino acids was 10 mg/mL. P denotes proline (trans-4-hydroxy) analogue.

The results presented in Table 4 show expected changes in the protein codes. At very low protein concentrations, the code degenerates into a string of zeros. However, at high

3. "Matrix Code"

Binary code redundancy may also be overcome by switching to codes with higher dimensions. As seen in FIGS.

13 and 14, reporters display changes in different DCP features in response to certain analytes (e.g., radial distribution of crystals in the DCP, crystal morphology, the presence or absence of a ring at the droplet edge, etc.,). Ascribing values of 0 and 1 to each such feature within a reporter's DCP produces a multidimensional code for each analyte that may be described by a matrix. An example of such a matrix code for Ova is presented in Table 5. In comparison to its binary code, the matrix descriptor may provide more information and may be predicted to allow discrimination between analytes even when their binary codes are identical. The binary 1 in the Ova code may originate from quite different DCP features, from their combinations, or from both.

TABLE 5

Matrix Code for Ova, Accounting for Several DCP Features Affected or Unaffected by the Presence of this Analyte[a]

| Feature of DCP[b] | Code | | | | | | | | | | | |
|---|---|---|---|---|---|---|---|---|---|---|---|---|
| | L | V | A | T | P | M | N | Q | K | S | F | H |
| Crystal size | 1 | 1 | 0 | 0 | 0 | 1 | 1 | 0 | 0 | 0 | 0 | 1 |
| Central crystal location | 1 | 0 | 0 | 0 | 0 | 1 | 0 | 0 | 0 | 0 | 0 | 0 |
| Peripheral crystal location | 0 | 1 | 1 | 1 | 0 | 0 | 0 | 0 | 0 | 0 | 0 | 0 |
| Loss of crystals | 0 | 0 | 0 | 0 | 0 | 0 | 1 | 0 | 1 | 0 | 0 | 0 |
| Binary code | 1 | 1 | 1 | 1 | 0 | 1 | 1 | 0 | 1 | 0 | 0 | 1 |

[a]denotes that 0.1 mg/mL Ova was added in equal volume to a 10 mg/mL microdroplet of each amino acid.
[b]denotes that binary units in the matrix code may have the same meaning as in the binary code, where 1 indicates changes in the feature and 0 indicates a lack of change or an insignificant change. P denotes proline (trans-4-hydroxy) analogue.

Recognition of Proteins in a Blind Experiment

In this experiment, four protein samples were prepared for blind testing, three of which belonged to the set of proteins with known codes and one of which had not been previously analyzed. The protein samples were subjected to the standard procedure of sample preparation including extensive dialysis against water, determination of the solution conductivity, and determination of the protein concentration using QCM. Protein solutions were then added to an array of amino acid microdroplets and DCPs of the solutions, controls were compared, and their binary codes were determined. Table 6 presents a comparison of the codes determined by this experiment with those found in our database. Proteins with known codes had a 92% identity to their database code (i.e., the codes obtained for blindly tested proteins differed from those in our database by 1 digit (different binary units are marked by italics) out of 12. The binary code of the unknown protein (i.e., human apotransferrin) was different from those in our database at a minimum of four digits.

TABLE 6

Blind Recognition of Unknown Substances by Binary Codes[a]

| Blind protein sample | Conc., mg/mL | Code found: | | | | | | | | | | | | Closest code in database: | | | | | |
|---|---|---|---|---|---|---|---|---|---|---|---|---|---|---|---|---|---|---|---|
| | | L | V | A | T | P | M | N | Q | K | S | F | H | L | V | A | T | P | M |
| Ova | 0.1 | 1 | 0 | 1 | 1 | 0 | 1 | 1 | 0 | 1 | 0 | 0 | 1 | 1 | 1 | 1 | 1 | 0 | 1 |
| HEWL | 0.3 | 1 | 1 | 1 | 0 | 0 | 1 | 1 | 0 | 0 | 0 | 0 | 1 | 1 | 1 | 1 | 0 | 0 | 1 |
| Apo-F | 0.1 | 1 | 0 | 0 | 0 | 0 | 1 | 1 | 1 | 1 | 0 | 0 | 1 | 1 | 1 | 1 | 1 | 0 | 1 |
| Con A | 0.1 | 1 | 1 | 1 | 1 | 1 | 1 | 0 | 1 | 0 | 0 | 1 | 0 | 1 | 1 | 1 | 1 | 1 | 1 |

| Blind protein sample | Closest code in database: | | | | | | % identified | Assignment |
|---|---|---|---|---|---|---|---|---|
| | N | Q | K | S | F | H | | |
| Ova | 1 | 0 | 1 | 0 | 0 | 1 | 92 | Ova |
| HEWL | 1 | 0 | 0 | 1 | 0 | 1 | 92 | HEWL |

TABLE 6-continued

Blind Recognition of Unknown Substances by Binary Codes[a]

| | | | | | | | | |
|---|---|---|---|---|---|---|---|---|
| Apo-F | 1 | 0 | 1 | 0 | 0 | 1 | 67 | Ova |
| Con A | 0 | 0 | 0 | 0 | 1 | 0 | 92 | Con A |

[a] indicates that protein, with the concentration indicated in the second column, was mixed with an equal volume of a 10 mg/mL amino acid solution.
P denotes proline (trans-4-hydroxy) analogue.

The blind experiment demonstrates that pure proteins can be reliably identified with the present method provided their solution concentration is known. The experiment also demonstrates that recognition is possible even if certain instabilities in DCPs result in variability of codes. It is expected that increasing the number of reporters and the code length will increase the identity percentage and thus lead to greater accuracy in identification.

Imagining Dry Residues

The following merely exemplifies a way of imaging dry residues.

The Axiovert 25 Zeiss microscope may be equipped with a digital camera (e.g., a Penguin 600CL digital camera) connected to a computer (e.g., a Dell Precision 450 Station). Droplets may be imaged in open air at a magnification of 50×. Among different modes of optical microscopy tested (e.g., transmission, dark-field, polarization, and phase contrast microscopy) phase contrast microscopy may yield images that display the largest number of distinguishable features. This yielding may be explained by the sensitivity of phase contrast microscopy to the thickness distribution in the transparent DCP. Phase contrast optical imaging may be used throughout. Generally, no notable pattern changes were observable upon storage of the amino acid DCP for one year in an air-conditioned room (humidity of approximately 30%, temperature 23° C).

The foregoing descriptions of the embodiments of the disclosure have been presented for purposes of illustration and description. They are not intended to be exhaustive or be limiting to the precise forms disclosed, and obviously many modifications and variations are possible in light of the above teaching. The illustrated embodiments were chosen and described in order to best explain the principles of the disclosure and its practical application to thereby enable others skilled in the art to best utilize it in various embodiments and with various modifications as are suited to the particular use contemplated without departing from the spirit and scope of the disclosure. In fact, after reading the above description, it will be apparent to one skilled in the relevant art(s) how to implement the disclosure in alternative embodiments. Thus, the disclosure should not be limited by any of the above described example embodiments.

In addition, it should be understood that any figures, graphs, tables, examples, etc., which highlight the functionality and advantages of the disclosure, are presented for example purposes only. The architecture of the disclosed is sufficiently flexible and configurable, such that it may be utilized in ways other than that shown. For example, the steps listed in any flowchart may be reordered or only optionally used in some embodiments.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the disclosure in any way.

Furthermore, it is the applicants' intent that only claims that include the express language "means for" or "step for" be interpreted under 35 U.S.C. § 112, paragraph 6. Claims that do not expressly include the phrase "means for" or "step for" are not to be interpreted under 35 U.S.C. § 112, paragraph 6.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method for recognizing an analyte relative to a set of reference compounds based on crystallization patterns, comprising:

A, creating a database of signatures for the set of reference compounds, wherein each signature for each reference compound represents a sequence of responses of crystallization patterns of a plurality of reporters to the presence of the reference compound, as the following:

1, for each of the reference compounds from the set, creating:

a, a series of first samples comprising mixtures of a solution of the reference compound with solutions of the plurality of reporters, wherein each of the solutions comprises a different reporter;

b, a series of second samples comprising the solutions of the plurality of reporters;

wherein the solutions of the plurality of reporters in the first samples and the second samples are close to identical;

2, depositing aliquots of the series of first samples and the series of second samples on a substrate and drying them under identical conditions to allow formation of a series of crystallization patterns for the first samples, "first crystallization patterns", and for the second samples, "second crystallization patterns";

3, acquiring images of the first crystallization patterns and the second crystallization patterns and comparing the images of the first crystallization patterns with the images of the second crystallization patterns pairwise;

4, creating a signature for each of the reference compounds by assigning:

a, a positive response for any change in the crystallization pattern of each of the reporters caused by the presence of the reference compound; and b, a negative response for lack of any change in the crystallization pattern of each of the reporters despite of the presence of the reference compound;

B, repeating steps 1-4 for the analyte, thus creating a signature for the analyte;

C, comparing the signature of the analyte with the signatures of the set of reference compounds from the database; and D, recognizing the analyte:
1, as one of the reference compounds from the database, if the signature for the analyte coincides with one of the signatures of the set of the reference compounds from the database; or
2, as a new compound relative to the set of the reference compounds, if the signature of the analyte does not coincide with any signature of the set of the reference compounds from the database.

2. The method according to claim 1, wherein the reference compounds are proteins.

3. The method according to claim 1, wherein each of the reporters is selected based on the following criteria:
a, water solubility;
b, chemical inertness;
c, an ability to keep the tertiary structure of the analyte the same; and
d, speed of crystallization.

4. The method according to claim 1, wherein each of the reporters is a molecule selected from a group consisting of:
a, amino acids;
b, salts of organic acids;
c, phosphorylated compounds;
d, vitamins;
e, biochemical metabolites capable of being used as crystal-forming substances; and
f, organic buffers.

5. The method according to claim 1, wherein the first samples and the second samples are prepared as arrays of droplets on a hydrophobic substrate comprising arrays of hydrophilic spots.

6. The method according to claim 1, wherein the signatures are binary codes comprising "1" for a positive response and "0" for a negative response.

7. A method for recognizing an analyte relative to a set of reference compounds based on crystallization patterns, comprising:
A, creating a database of signatures for the set of the reference compounds, wherein each signature for each reference compound represents a sequence of responses of crystallization patterns of a plurality of reporters to the presence of the reference compound, as the following:
1, for each of the reference compounds from the set, creating a series of reporter solutions, wherein each of the reporter solutions comprises a different reporter;
2, creating a series of reference compound solutions;
3, providing at least first and second hydrophobic substrates with arrays of hydrophilic spots, wherein the number of rows of the arrays equals at least the number of the reference compounds plus at least one, and the number of columns of the arrays equals at least the number of the reporters;
4, depositing droplets of the series of the reporter solutions on the hydrophilic spots of each row of the first substrate;
5, depositing droplets of each of the reference compound solutions on the hydrophilic spots of each row of the second substrate, except for at least one row, in which only a solvent used for the reference compound solutions is deposited;
6, bringing the substrates together so that the droplets deposited in the hydrophilic spots on the first substrate contact and mix with the corresponding droplets on the second substrate, while leaving at least one control row without a reference compound solution;
7, separating the substrates and drying resulting droplets under identical conditions to allow formation of crystallization patterns of mixtures of the reference compounds and the reporters, and of control crystallization patterns of the reporters from the at least one control row;
8, acquiring images of the crystallization patterns of the mixtures and images of the control crystallization patterns of the reporters, and comparing them;
9, creating a signature for each of the reference compounds by assigning:
a, a positive response for any change in the crystallization pattern of each of the reporter caused by the presence of the reference compound; and
b, a negative response for lack of any change in the crystallization pattern of each of the reporter despite of the presence of the reference compound;

B, repeating steps 1-9 for the analyte, thus creating a signature for the analyte;

C, comparing the signature of the analyte with the signatures of the set of reference compounds from the database; and D, recognizing the analyte:
1, as one of the reference compounds from the database, if the signature for the analyte coincides with one of the signatures of the set of the reference compounds from the database; or
2, as a new compound relative to the set of the reference compounds, if the signature of the analyte does not coincide with any signature of the set of the reference compounds from the database.

8. The method according to claim 7, wherein the reference compounds are proteins.

9. The method according to claim 7, wherein each of the reporters is selected based on the following criteria:
a, water solubility;
b, chemical inertness;
c, an ability to keep the tertiary structure of the analyte the same; and
d, speed of crystallization.

10. The method according to claim 7, wherein each of the reporters is a molecule selected from a group consisting of:
a, amino acids;
b, salts of organic acids;
c, phosphorylated compounds;
d, vitamins;
e, biochemical metabolites capable of being used as crystal-forming substances; and
f, organic buffers.

11. The method according to claim 7, wherein the signatures are binary codes, comprising "1" for a positive response and "0" for a negative response.

12. The method according to claim 7, wherein the reporter solutions are dried on the first substrate prior to the contact.

13. A method for recognizing an analyte relative to a set of reference compounds based on crystallization patterns, comprising:
A, creating a database of signatures for the set of reference compounds, wherein each signature for each reference compound represents a sequence of responses of crystallization patterns of a plurality of reporters to the presence of the reference compound, as the following:

1, for each of the reference compounds from the set, creating a series of reporter solutions, wherein each of the reporter solutions comprises a different reporter;

2, providing a hydrophobic substrate with arrays of hydrophilic spots, wherein the number of rows of the arrays equals at least the number of the reference compounds plus at least one, and the number of columns of the arrays equals at least the number of the reporters;

3, depositing droplets of the series of the reporter solutions in the hydrophilic spots of each row of the substrate;

4, creating a series of reference compound solutions for the set of the reference compounds;

5, adding droplets of each of the reference compound solutions to the hydrophilic spots of different rows of the substrate, except for at least one row, in which only solvent used for the reference compound solutions is added in equal volume, thus mixing the droplets of the reporter solutions with the droplets of the reference compound solutions, while leaving at least one control row without a reference compound solution;

6, drying mixed droplets to allow formation of crystallization patterns of mixtures of the reference compounds and the reporters, and of control crystallization patterns of the reporters from the at least one control row;

7, acquiring images of the crystallization patterns of the mixtures and images of the control crystallization patterns of the reporters, and comparing them;

8, creating a signature for each of the reference compounds by assigning:
  a, a positive response for any change in the crystallization pattern of each of the reporters caused by the presence of the reference compound; and
  b, a negative response for lack of any change in the crystallization pattern of each of the reporters despite of the presence of the reference compound;

B, repeating steps 1-8 for the analyte, thus creating a signature for the analyte;

C, comparing the signature of the analyte with the signatures of the set of reference compounds from the database; and D, recognizing the analyte:
  1, as one of the reference compounds from the database, if the signature for the analyte coincides with one of the signatures of the set of the reference compounds from the database; or
  2, as a new compound relative to the set of reference compounds, if the signature of the analyte does not coincide with any signature of the set of the reference compounds from the database.

14. The method according to claim 13, wherein the reference compounds are proteins.

15. The method according to claim 13, wherein each of the reporters is selected based on the following criteria:
  a, water solubility;
  b, chemical inertness;
  c, an ability to keep the tertiary structure of the analyte the same; and
  d, speed of crystallization.

16. The method according to claim 13, wherein each of the reporters is a molecule selected from a group consisting of:
  a, amino acids;
  b, salts of organic acids;
  c, phosphorylated compounds;
  d, vitamins;
  e, biochemical metabolites capable of being used as crystal-forming substances; and
  f, organic buffer.

17. The method according to claim 13, wherein the signatures are binary codes, comprising "1" for a positive response and "0" for a negative response.

18. The method according to claim 13, wherein the reference compounds, the analyte, and the solvent are electrosprayed onto the droplets of the reporter solutions that are electrically charged.

19. The method according to claim 13, wherein the reference compounds, the analyte, and the solvent are sprayed onto the droplets of the reporter solutions through gas-phase.

* * * * *